United States Patent
Park et al.

(10) Patent No.: US 8,012,921 B2
(45) Date of Patent: Sep. 6, 2011

(54) COMPOSITION FOR STRIPPING PHOTORESIST AND METHOD FOR MANUFACTURING THIN TRANSISTOR ARRAY PANEL USING THE SAME

(75) Inventors: Hong-Sick Park, Suwon-si (KR); Jong-Hyun Jeong, Seoul (KR); Suk-Il Yoon, Hwaseong-si (KR); Seong-Bae Kim, Seoul (KR); Wy-Yong Kim, Seoul (KR); Soon-Beom Huh, Siheung-si (KR); Byung-Uk Kim, Hwaseong-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 801 days.

(21) Appl. No.: 11/865,795

(22) Filed: Oct. 2, 2007

(65) Prior Publication Data

US 2008/0085850 A1 Apr. 10, 2008

Related U.S. Application Data

(62) Division of application No. 11/217,400, filed on Sep. 2, 2005, now Pat. No. 7,294,518.

(30) Foreign Application Priority Data

Sep. 24, 2004 (KR) .................. 10-2004-0077501

(51) Int. Cl.
C11D 7/50 (2006.01)
(52) U.S. Cl. ...................................... 510/175; 510/176

(58) Field of Classification Search .................. 510/175, 510/176
See application file for complete search history.

(56) References Cited

U.S. PATENT DOCUMENTS

| | | | |
|---|---|---|---|
| 5,795,702 A | 8/1998 | Tanabe et al. | |
| 5,827,757 A | 10/1998 | Robinson, Jr. et al. | |
| 6,218,087 B1 * | 4/2001 | Tanabe et al. | 430/331 |
| 6,440,326 B1 * | 8/2002 | Maruyama et al. | 252/79.1 |
| 7,098,539 B2 | 8/2006 | Gotoh et al. | |
| 7,294,518 B2 | 11/2007 | Park et al. | |
| 2002/0037819 A1 * | 3/2002 | Sahbari | 510/175 |
| 2003/0130149 A1 * | 7/2003 | Zhou et al. | 510/176 |
| 2003/0144162 A1 | 7/2003 | Chae et al. | |
| 2003/0181344 A1 * | 9/2003 | Ikemoto et al. | 510/175 |

FOREIGN PATENT DOCUMENTS

| | | |
|---|---|---|
| JP | 2000-199971 | 7/2000 |
| JP | 2005-331913 | 2/2005 |
| JP | 2006-079093 | 3/2006 |

(Continued)

OTHER PUBLICATIONS

European Patent Office Communication dated Apr. 19, 2007 enclosing European Search Report for Samsung Electronics Co., Ltd., Application No. 05108755-9-1226.

(Continued)

*Primary Examiner* — Gregory E Webb
(74) *Attorney, Agent, or Firm* — F. Chau & Associates, LLC

(57) ABSTRACT

The present invention provides a photoresist stripper including about 5 wt % to about 20 wt % alcohol amine, about 40 wt % to about 70 wt % glycol ether, about 20 wt % to about 40 wt % N-methyl pyrrolidone, and about 0.2 wt % to about 6 wt % chelating agent.

7 Claims, 30 Drawing Sheets

FOREIGN PATENT DOCUMENTS

| | | |
|---|---|---|
| KR | 1020000014840 A | 3/2000 |
| KR | 10-0345033 B | 7/2002 |
| KR | 1020040035368 A | 4/2004 |
| WO | WO03107434 | 12/2003 |
| WO | WO2004053970 | 6/2004 |

OTHER PUBLICATIONS

European Patent Office Communication dated Apr. 19, 2007 enclosing European Search Report fro Samsung Electronics Co., Ltd. Application No. 05108755-9-1226.

\* cited by examiner

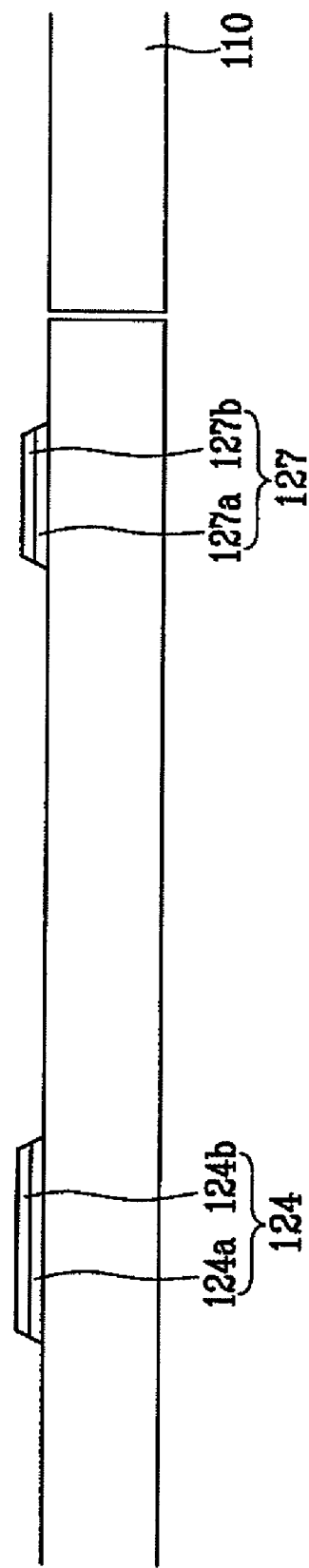

COMPOSITION FOR STRIPPING PHOTORESIST AND METHOD FOR MANUFACTURING THIN TRANSISTOR ARRAY PANEL USING THE SAME

CROSS REFERENCE TO RELATED APPLICATION

This application is a divisional of U.S. patent application Ser. No. 11/217,400, filed Sep. 2, 2005 now U.S. Pat. No. 7,294,518 which claims priority to Korean Patent Application No. 10-2004-0077501, filed Sep. 24, 2004, the disclosures of which are incorporated by reference herein in their entireties.

BACKGROUND OF THE INVENTION

1. Field of the Invention

The present description relates to a stripper for photoresist and a method for manufacturing a thin film transistor (TFT) array panel using the same.

2. Description of the Related Art

Liquid crystal displays (LCDs) are some of the most widely used flat panel displays. An LCD includes a liquid crystal (LC) layer that is interposed between two panels that are provided with field-generating electrodes. The LCD displays images by applying voltages to the field-generating electrodes to generate an electric field in the LC layer which orients the LC molecules in the LC layer to adjust the polarization of incident light.

An LCD that includes two panels that are provided with field-generating electrodes, wherein one panel has a plurality of pixel electrodes that are arranged in a matrix and the other has a common electrode that covers the entire surface of the panel, dominates the LCD market.

The LCD displays images by applying a different voltage to each pixel electrode. For this reason, TFTs that have three terminals to switch voltages that are applied to the pixel electrodes are connected to the pixel electrodes. In addition, gate lines that transmit signals for controlling the thin film transistors and data lines that transmit voltages that are applied to the pixel electrodes are formed on a thin film transistor array panel.

A TFT is a switching element that transmits image signals from the data line to the pixel electrode in response to scanning signals from the gate line. The TFTs are applied to active matrix organic light emitting displays to control light emitting elements.

Considering the trend of increasing LCD sizes, a material that has low resistivity is required since the lengths of the gate lines and data lines also increase along with the LCD size.

Aluminum is a metal that has a sufficiently low resistivity and may be used in an LCD. However, since aluminum has weak chemical resistance, it is vulnerable to an etchant and a photoresist stripper that are sued for patterning thin film patterns. Accordingly, signal lines made of aluminum often have a defective profile such as an undercut and an overhang.

SUMMARY OF THE INVENTION

The present invention provides a photoresist stripper that dissolves and strips photoresist coatings and does not erode metal lines under the photoresist.

The present invention also provides a method for manufacturing a TFT array panel using the photoresist stripper.

Additional features of the invention will be set forth in the description which follows, and in part will be apparent from the description, or may be learned by practice of the invention.

The present invention discloses a photoresist stripper comprising about 5 wt % to about 20 wt % of an alcohol amine, about 40 wt % to about 70 wt % of a glycol ether, about 20 wt % to 40 wt % of N-methyl pyrrolidone, and about 0.2 wt % to about 6 wt % of a chelating agent.

The present invention also discloses a photoresist stripper comprising about 5 wt % to about 20 wt % of N-monoethanol amine, about 40 wt % to about 70 wt % of butyl diglycol, about 20 wt % to about 40 wt % of N-methyl pyrrolidone, about 0.1 wt % to about 3 wt % of methyl gallate, and about 0.1 wt % to about 3 wt % of hydroxyl ethyl piperazine piperasane.

The present invention also discloses a method for manufacturing a TFT array panel using the photoresist stripper comprising forming a gate line having a gate electrode on an insulating substrate, depositing a gate insulating layer, a semiconductor layer, and a ohmic contact layer on the gate line, patterning the semiconductor layer and the ohmic contact layer, and forming a drain electrode and a data line having a source electrode on the gate insulating layer and the ohmic contact layer, where the drain electrode faces the source electrode with a gap therebetween. The method further comprises forming a passivation layer having a contact hole exposing the drain electrode, and forming a pixel electrode connected to the drain electrode through the contact hole on the passivation layer. At least one step of forming the gate line and forming the drain electrode and the data line includes stripping a photoresist layer with a photoresist stripper comprising about 5 wt % to about 20 wt % of an alcohol amine, about 40 wt % to about 70 wt % of a glycol ether, about 20 wt % to about 40 wt % of N-methyl pyrrolidone, and about 0.2 wt % to about 6 wt % of a chelating agent.

It is to be understood that both the foregoing general description and the following detailed description are exemplary and explanatory and are intended to provide further explanation of the invention as claimed.

BRIEF DESCRIPTION OF THE DRAWINGS

FIG. 4, FIG. 4, FIG. 5, FIG. 6B, FIG. 7B, FIG. 8, FIG. 9, FIG. 10, FIG. 11B, and FIG. 12B are sectional views that sequentially illustrate steps of manufacturing a TFT array panel for an LCD according to the exemplary embodiment of FIG. 1 and FIG. 2.

DETAILED DESCRIPTION OF THE ILLUSTRATED EMBODIMENTS

Figure 1:
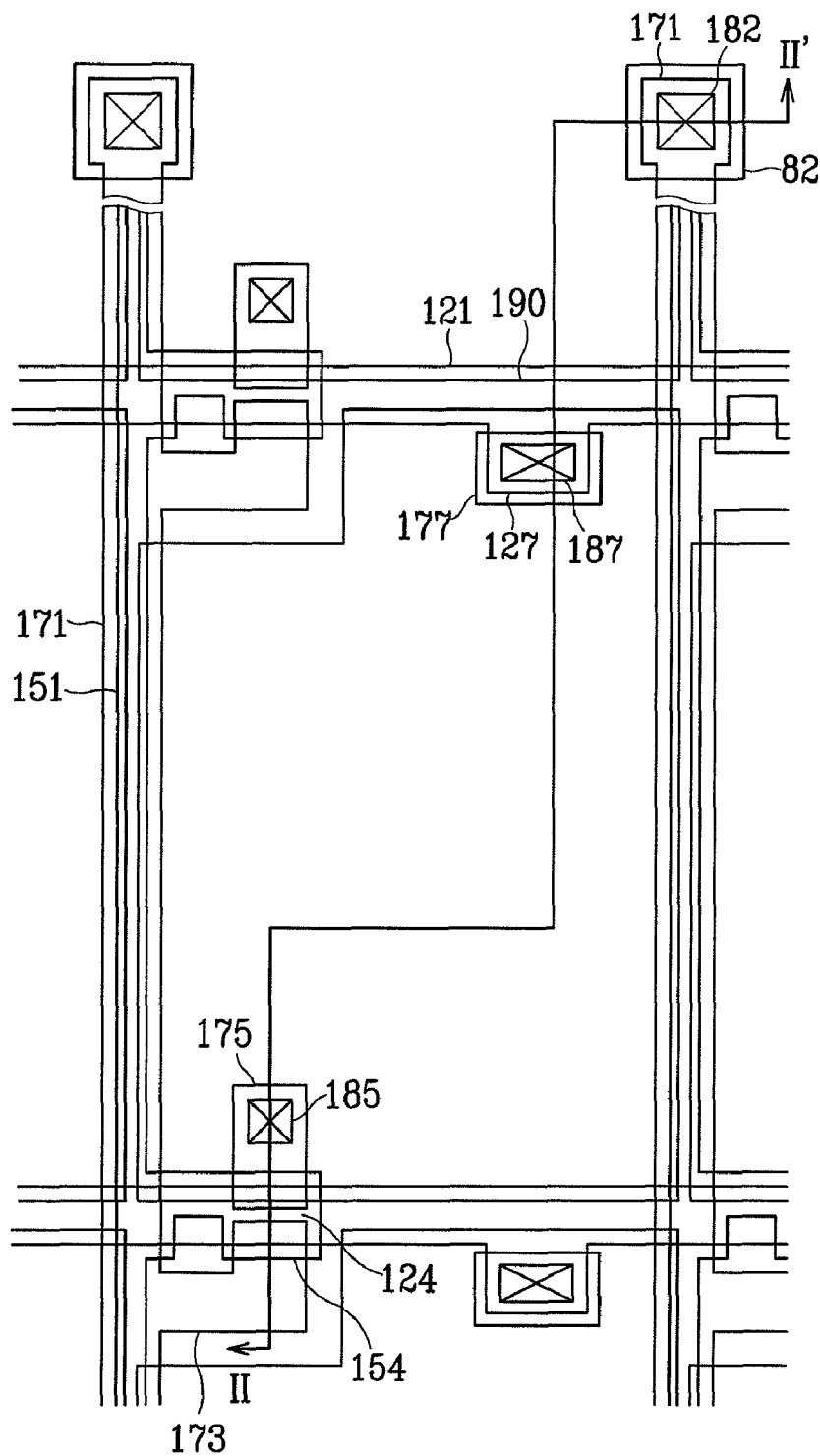
FIG. 1 is a layout view of a TFT array panel for an LCD according to an exemplary embodiment of the present invention.

The photoresist stripper of the present invention has good stripping abilities and may not corrode metal. In addition, the photoresist stripper prevents a defective profile of signal lines such as undercut and overhang.

The present invention provides a photoresist stripper comprising about 5 wt % to about 20 wt % of an alcohol amine, about 40 wt % to about 70 wt % of a glycol ether, about 20 wt % to about 40 wt % of N-methyl pyrrolidone, and about 0.2 wt % to about 6 wt % of a chelating agent.

The alcohol amine may include, but is not limited to monoisopropanol amine ($CH_3CH(OH)CH_2NH_2$) or N-monoethanol amine ($HO(CH_2)_2NH_2$). The alcohol amine is preferably N-monoethanol amine ($HO(CH_2)_2NH_2$). The photoresist stripper may comprise about 5 wt % to about 20 wt % of an alcohol amine. When the photoresist stripper comprises less than 5 wt % of alcohol amine, the stripping ability of the photoresist stripper is weakened due to evaporation of the alcohol amine as the stripping process progresses. Accordingly, particles of the photoresist remain on the patterned film. When the photoresist stripper comprises more than 20 wt % alcohol amine, the photoresist stripper has too high an angle of contact with the photoresist. Accordingly the photoresist stripper does not absorb into the photoresist well.

Glycol ether is added to the photoresist stripper to dissolve the photoresist and to control surface tension. The glycol ether may include, but is not limited to carbitol [$C_2H_5O(CH_2CH_2O)_2H$)], methyl diglycol [$CH_3O(CH_2CH_2O)_2H$], and butyl diglycol [$C_4H_9)(CH_2CH_2O)_2H$]. The glycol ether is preferably butyl diglycol. The photoresist stripper comprises about 40 wt % to about 70 wt % of glycol ether. When the photoresist stripper comprises less than 40 wt % glycol ether, the photoresist stripper has too high an angle of contact with the photoresist. Accordingly the photoresist stripper does not absorb into the photoresist well. When the photoresist stripper comprises more than 70 wt % glycol ether, the photoresist stripping ability of the photoresist stripper is degraded.

N-methyl pyrrolidone [$C_5H_9NO$] is also added to the photoresist stripper to dissolve the photoresist along with glycol ether. Since N-methyl pyrrolidone has a strong polarity, N-methyl pyrrolidone preserves the stripping ability of the photoresist stripper even after repeated stripping. The photoresist stripper comprises about 20 wt % to about 40 wt % of N-methyl pyrrolidone. When the photoresist stripper comprises less than 20 wt % N-methyl pyrrolidone, its ability of dissolving photoresist is too weak. When the photoresist stripper comprises more than 40 wt % N-methyl pyrrolidone, the photoresist stripper has too strong a polarity which requires an additional amount of alcohol amine.

A chelating agent reduces galvanic corrosion of a metal such as aluminum, which has weak chemical resistance. When double metal layers of aluminum and molybdenum are soaked by a photoresist stripper, electrons migrate from the aluminum layer to the molybdenum layer to corrode the aluminum layer by galvanic corrosion. When the photoresist stripper contains a chelating agent, the chelating agent reduces galvanic corrosion to prevent the aluminum layer from being undercut. The photoresist stripper preferably contains one of methyl gallate, hydroxyl ethyl piperazine piperasane (HEP), and their mixture as a chelating agent.

the photoresist stripper may comprise about 0.2 wt % to about 6 wt % of a chelating agent. When the photoresist stripper comprises less than 0.2 wt % of the chelating agent, the effect of restraining galvanic corrosion is not shown. When the photoresist stripper comprises more than 6 wt % of the chelating agent, metal layers may be adversely affected.

The present invention also provides a method for manufacturing a TFT array panel using the mentioned photoresist stripper.

Henceforth, preferred embodiments of the present invention will be described more fully with reference to the accompanying drawings, in which preferred embodiments of the invention are shown. The present invention may, however, be embodied in different forms and should not be construed as being limited to the embodiments set forth herein. Rather, these embodiments are provided so that this disclosure will be thorough and complete, and will fully convey the scope of the invention to those skilled in the art.

In the drawings, the thickness of layers, films, and regions are exaggerated for clarity. Like numerals refer to like elements throughout. It will be understood that when an element such as a layer, film region, or substrate is referred to as being "on" another element, it can be directly on the other element or intervening elements may also be present.

Embodiment 1 and Embodiment 2

In Embodiment 1 and Embodiment 2, the tripping ability and the degree of aluminum corrosion of the photoresist stripper of the present invention will be compared with a conventional photoresist stripper. Photoresist strippers that comprise an alcohol amine, a solvent of an alcohol amine, and other elements are prepared according to Table 1.

In the present embodiment, N-monoethanol amine (N-MEA) is applied as an alcohol amine that strips a photoresist. Butyl diglycol (BDG) and N-methyl pyrrolidone (NMP) are applied as solvents. Methyl gallate (MG) and hydroxyl ethyl piperazine piperasane (HEP) are applied as chelating agents. The references are conventional photoresist strippers comprising N-MEA, BDG, and NMP or N-MEA, dimethylsulfoxide (DMSO), and deionized water (DI).

TABLE 1

| | Unit: wt % | | | |
|---|---|---|---|---|
| | Embodiment 1 | Embodiment 2 | Reference 1 | Reference 2 |
| N-MEA | 15 | 18 | 10 | 30 |
| BDG | 47 | 51 | 35 | — |
| NMP | 35 | 25 | 55 | — |
| DMSO | — | — | — | 50 |
| MG | 1.5 | 3 | — | — |
| HEP | 1.5 | 3 | — | — |
| DI | — | — | — | 20 |

Stripping ability and degree of aluminum corrosion of the photoresist strippers according to Embodiment 1, Embodiment 2, Reference 1 and Reference 2 were measured.

A. Test of Stripping Ability

Photoresist layers were spin-coated to a thickness of 2.0 μm of four bare glass plates with a size of 10 cm×10 cm. At a temperature of about 65° C., the photoresist strippers of Embodiment 1, Embodiment 2, Reference 1, and Reference 2 were respectively sprayed on the four photoresist layers for over 180 seconds and then cleaned with deionized water for 30 seconds. Next, the four glass plates were observed by the naked eye and through a microscope.

It was found that the photoresist strippers of Embodiment 1 and Embodiment 2 showed a high stripping ability and the photoresist strippers of Reference 1 showed a somewhat degraded stripping ability compared to the photoresist strippers of Embodiment and Embodiment 2. The photoresist stripper of Reference 2 also showed a poor stripping ability.

B. Test of Degree of Aluminum Corrosion

Double layered metal patterns including an aluminum layer and a molybdenum layer were formed on three bare glass plates with a size of 10 cm×10 cm using photoresist layers. The photoresist strippers of Embodiment 1, Embodiment 2, Reference 1, and Reference 2 were respectively sprayed on the photoresist layers for over 150 seconds, cleaned with deionized water for 30 seconds, and then dried.

Figure 23A:
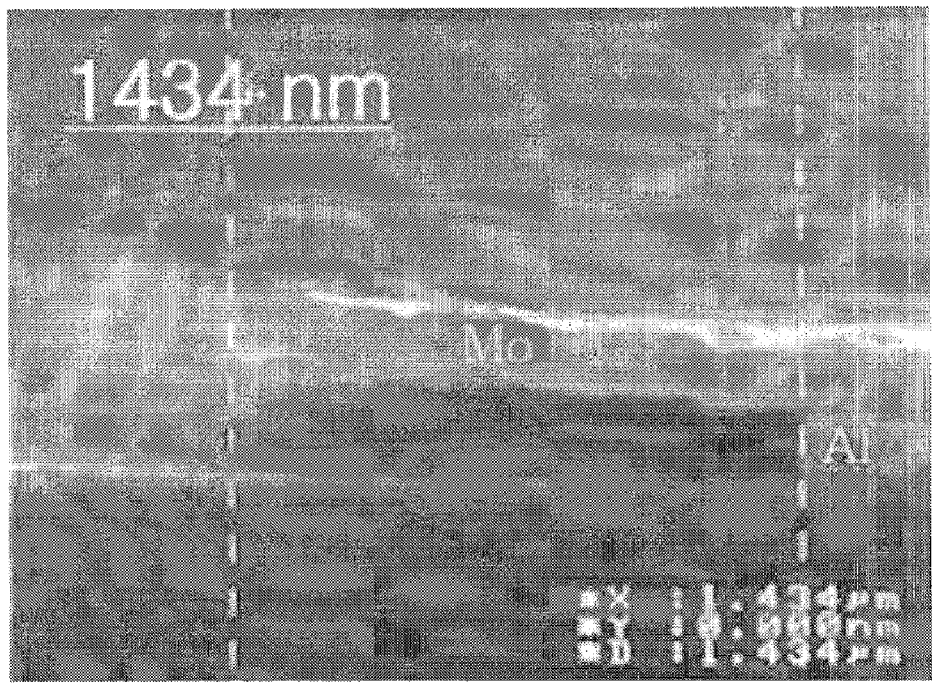
FIG. 23A is a sectional photograph showing eroded features of an aluminum layer using a conventional photoresist stripper.
Figure 23B:
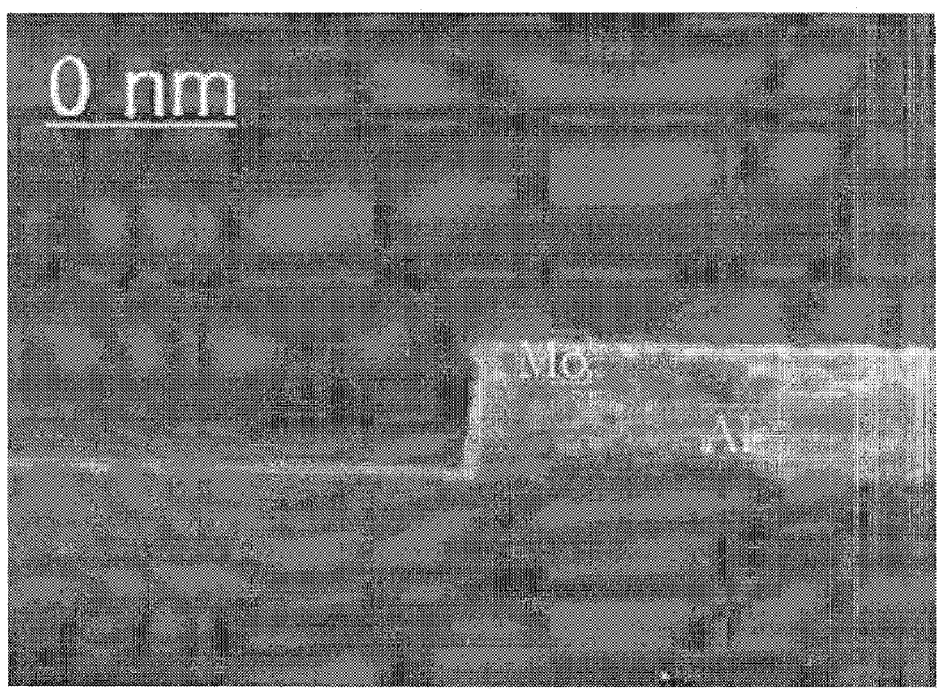
FIG. 23B is a sectional photograph showing eroded features of an aluminum layer using a photoresist stripper according to an exemplary embodiment of the present invention.

As shown in FIG. 23B, the metal patterns applied with the photoresist strippers of Embodiment 1 and Embodiment 2 had fine profiles without corrosion of the lower layer of aluminum. However, as shown in FIG. 23A the metal pattern applied with the photoresist strippers of Reference 1 had a poor profile including a 1434 nm undercut of the lower layer of aluminum.

Thus, the photoresist strippers of Embodiment 1 and Embodiment 2 of the present invention have superior stripping ability and are less corrosive to aluminum than the conventional photoresist strippers.

Embodiment 3

A TFT array panel fabricated using a photoresist stripper of Embodiment 1 and a photoresist stripper of Embodiment 2 and manufacturing methods thereof will be described in detail with reference to the accompanying drawings.

Figure 2:
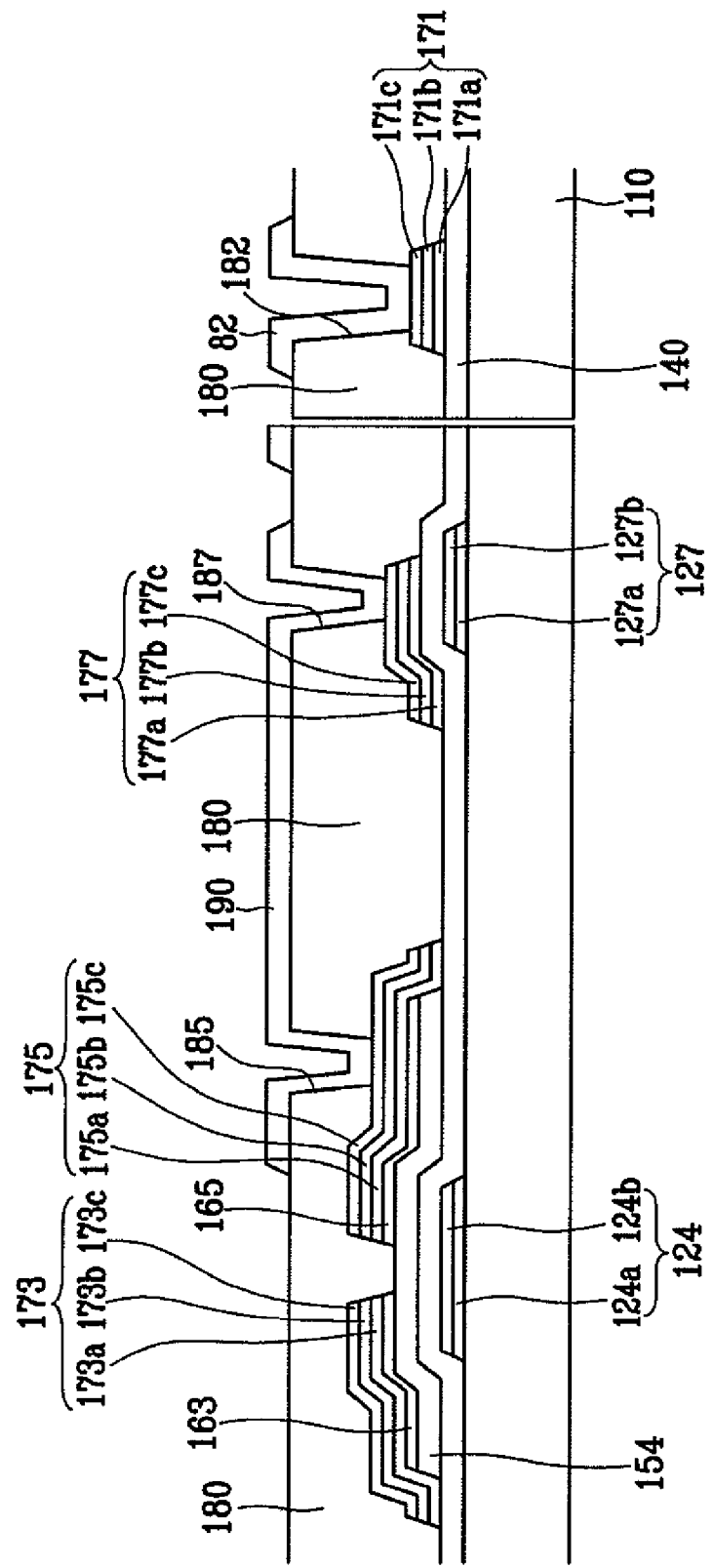
FIG. 2 is a sectional view of the TFT array panel shown in FIG. 1 taken along line II-II'.

FIG. 1 is a layout view of a TFT array panel for an LCD of an exemplary embodiment of the present invention, and FIG. 2 is a sectional view of the TFT array panel shown in FIG. 1 taken along line II-II'.

A plurality of gate lines 121 for transmitting gate signals are formed on an insulating substrate 110. The gate lines 121 are mainly formed in a horizontal direction, and partial portions thereof become a plurality of gate electrodes 124. Also, different partial portions thereof that extend in a lower direction become a plurality of expansions 127.

The gate line 121 has lower layers 124a and 127a and upper layers 124b and 127b. The lower layers 124a and 127a may comprise an aluminum-containing metal such as pure aluminum or aluminum-neodymium (Al—Nd) but is not limited thereto. The upper layers 124b and 127b may comprise, but are not limited to molybdenum.

The lateral sides of the upper layers 124b and 127b and lower layers 124a and 127a are inclined relative to a surface of the substrate 110 with an inclination angle ranging from about 30 degrees to about 80 degrees.

A gate insulating layer 140 preferably comprising silicon nitride (SiNx) is formed on the gate lines 121.

A plurality of semiconductor stripes 151, preferably comprising hydrogenated amorphous silicon ("a-Si"), are formed on the gate insulating layer 140. Each semiconductor stripe 151 extends substantially in the longitudinal direction and curves periodically. Each semiconductor stripe 151 has a plurality of projections 154 that branch out toward the gate electrodes 124. The width of each semiconductor stripe 151 increases near the gate lines 121 such that the semiconductor stripe 151 covers large areas of the gate lines 121.

A plurality of ohmic contact 163 and 165, preferably made of silicide or n+ hydrogenated a-Si heavily doped with an n-type impurity, are located in pairs on the projections 154 of semiconductor stripes 151.

The edge surfaces of the semiconductor stripes 151 and the ohmic contacts 163 and 165 are tapered such that the inclination angles of the edge surfaces of the semiconductor stripes 151 and the ohmic contacts 163 and 165 are preferably in a range of about 30 degrees to about 80 degrees.

A plurality of data lines 171, a plurality of drain electrodes 175, and a plurality of storage capacitor conductors 177 are formed on the ohmic contacts 163 and 165 and the gate insulating layer 140.

The data lines 171, which transmit data voltages, extend substantially in the longitudinal direction and intersect the gate lines 121 to define pixel areas that are arranged in a matrix. A plurality of branches of each data line 171 that project toward the drain electrodes 175 form a plurality of source electrodes 173. Each pair of the source electrodes 173 and the drain electrodes 175 are separated from each other on the gate electrodes 124, and oppose each other. Each data line 171 has an end portion 179 for connection with another layer or external driving circuits.

The data line 171, the drain electrode 175, and the storage capacitor conductor 177 have first layers 171a, 175a, second layers 171b, 175b, and 177b, and third layers 171c, 175c, and 177c, respectively. The first layers 171a, 175a, and 177 a and the third layers 171c, 175c, and 177c are respectively disposed at lower and upper sides of the second layers 171b, 175b, and 177b. The first layers 171a, 175a, and 177a and the third layers 171c, 175c, and 177c comprise a molybdenum-containing metal. The second layers 171b, 175b, and 177b comprise an aluminum-containing metal.

Since the aluminum or aluminum alloy layer with low resistivity is disposed between the two molybdenum-alloy layers, the data line 171 has low resistivity and the aluminum or aluminum-alloy layer is prevented from contacting the semiconductor and pixel electrodes that may cause poor contact. Accordingly, degradation of TFTs caused by poor contact is efficiently prevented.

A gate electrode 124, a source electrode 173, and a drain electrode 175, along with a projection 154 of a semiconductor stripe 151 form a TFT with a channel that is formed in the projection 154 that is disposed between the source electrode 173 and the drain electrode 175. The storage capacitor conductor 177 is overlapped with the expansion 127 of the gate line 121.

The data lines 171, the drain electrodes 175, and the storage capacitor conductor 177 have tapered edge surfaces such that the inclination angles of the edge surfaces range from about 30 degrees to about 80 degrees.

The ohmic contacts 164 and 165 are interposed between the semiconductor stripe 151 and the data line 171 and between the drain electrode 175 and the projection 154 of the semiconductor stripe 151 to reduce contact resistance therebetween. The semiconductor stripe 151 is partially exposed at the place between the source electrode 173 and the drain electrode 175 and at the other places that are not covered with the data line 171 and the drain electrode 175. Most of the semiconductor stripe 151 is narrower than the data line 171, but the width of the semiconductor stripe 151 broaches near a place where the semiconductor stripe 151 and the gate line 121 intersect to prevent disconnection of the data line 171.

A passivation layer 180 is provided on the data line 171, the drain electrode 175, the storage capacitor conductor 177, and the exposed region of the semiconductor stripe 151. The passivation layer 180 comprises an organic material having substantial planarization properties and photosensitivity or an insulating material with a low dielectric constant such as a-Si:C:O, a Si:O:F, for example. This passivation layer 180 is formed by plasma enhanced vapor deposition (PECVD). To prevent the organic material of the passivation layer 180 from contacting the semiconductor stripes 151 that are exposed between the data line 171 and the drain electrode 175, the passivation layer 180 may be structured so that an insulating layer comprising SiNx or SiO$_2$ is additionally formed under the organic material layer.

In the passivation layer 180, a plurality of contact holes 185, 187, and 182 are formed to expose the drain electrode 175, the storage capacitor conductor 177, and an end portion of the data line 171, respectively.

A plurality of pixel electrodes 190 and a plurality of contact assistants 82, which are made of indium zinc oxide (IZO) or indium tin oxide (ITO), are formed on the passivation layer 180.

Since the pixel electrode 190 is coupled with the drain electrode 175 and the storage capacitor conductor 177 through the contact holes 185 and 187, respectively, the pixel electrode 190 receives the data voltage from the drain electrode 175 and transmits it to the storage capacitor conductor 177.

The pixel electrode 190, to which the data voltage is applied, generates an electric field with a common electrode (not illustrated) of the opposite panel (not illustrated) to which a common voltage is applied, so that a liquid crystal molecules in the liquid crystal layer may be aligned.

Also, as mentioned above, the pixel electrode 190 and the common electrode form a capacitor to store and preserve the received voltage after the TFT is turned off. This capacitor is referred to as a "liquid crystal capacitor." To enhance the voltage storage ability, another capacitor is coupled in parallel with the liquid crystal capacitor and will be referred to as a "storage capacitor." the storage capacitor is formed at an overlapping portion of the pixel electrode 190 and the adjacent gate line 121, which will be referred to as a "previous gate line." The expansion 127 of the gate line 121 is provided to ensure the largest possible overlap and to thus increase the storage capacity of the storage capacitor. The storage capacitor conductor 177 is coupled with the pixel electrode 190 and is overlapped with the expansion 127, and is provided at the bottom of the passivation layer 180 so that the pixel electrode 190 becomes close to the previous gate line 121.

The pixel electrode 190 may be overlapped with the adjacent gate line 121 and the adjacent data line 171 to enhance the aperture ratio.

The contact assistant 82 supplements adhesion between the end portion of the data line 171 and the exterior devices, such as a driving integrated circuit, and protects them. Applying the contact assistant 82 is optional since it is not an essential element.

A method for manufacturing a TFT array panel will be now described in detail with reference to FIG. 3, FIG. 4, FIG. 5, FIG. 6A, FIG. 6B, FIG. 7A, FIG. 7B, FIG. 8, FIG. 9, FIG. 10, FIG. 11A, FIG. 11B, FIG. 12A and FIG. 12B as well as FIG. 1 and FIG. 2.

Figure 3:
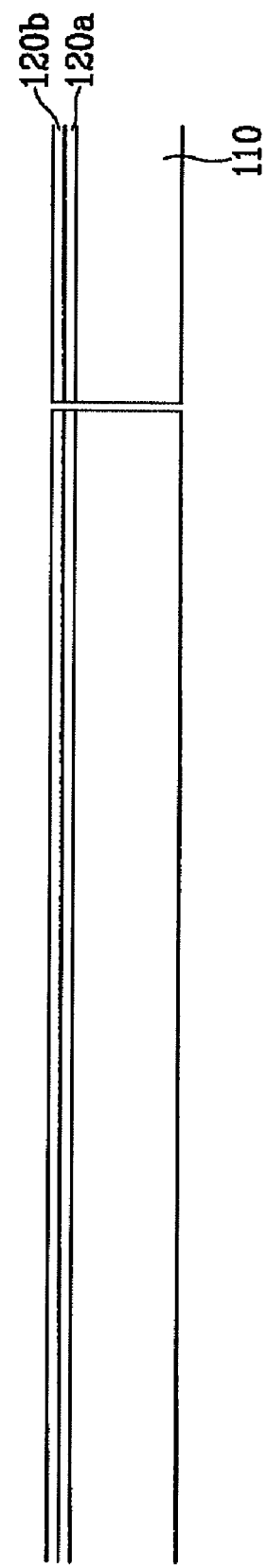

As shown in FIG. 3, a first metal layer 120a and a second metal layer 120b are sequentially deposited on an insulating substrate 110. The first and second metal layers 120a and 120b may be deposited by co-sputtering, which is performed as follows.

Two targets are installed in the same sputtering chamber for the co-sputtering. One target comprises aluminum or aluminum-neodymium, and the other target comprises a molybdenum alloy.

At first, power is applied to the aluminum (or aluminum-neodymium) target while no power is applied to the molybdenum-alloy target to deposit a lower layer of aluminum (or aluminum-neodymium). The thickness of the lower layer is preferably about 2,500 Å.

Next, power is applied to the molybdenum-alloy target and not to the aluminum (or aluminum-neodymium) target to deposit an upper layer.

Figure 4:
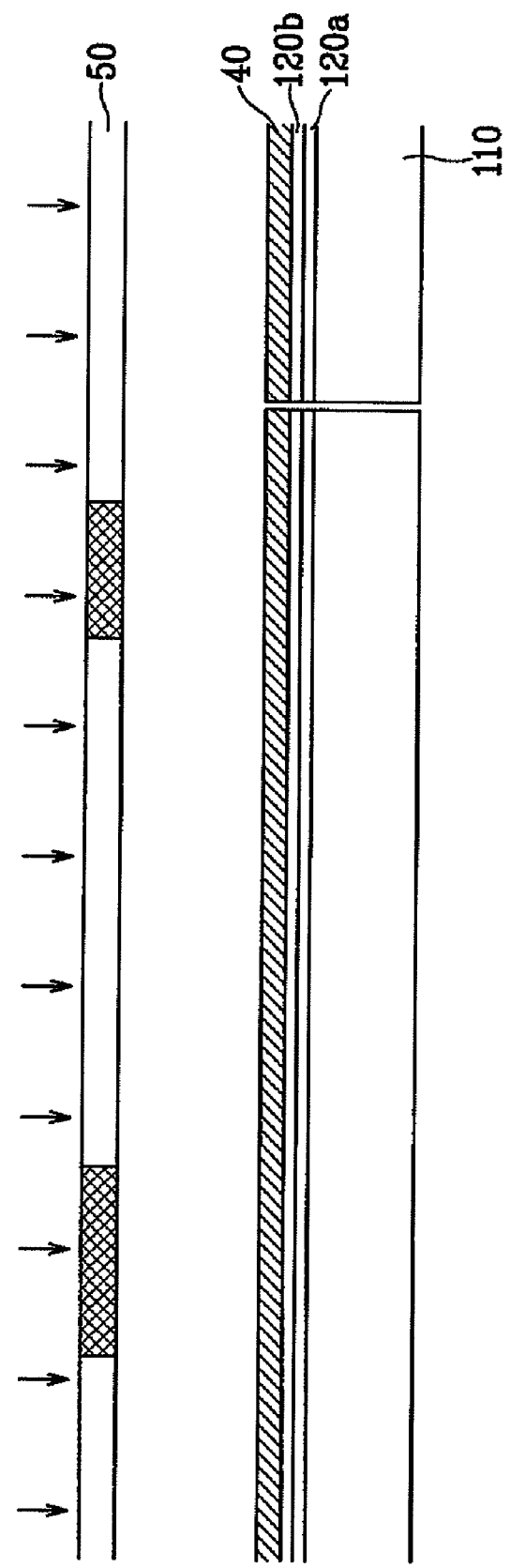

Next, as shown in FIG. 4, a photoresist layer 40 is coated on the second metal layer 120b and is exposed to light through a photomask 50. Then, the photoresist layer 40 is developed.

Figure 5:
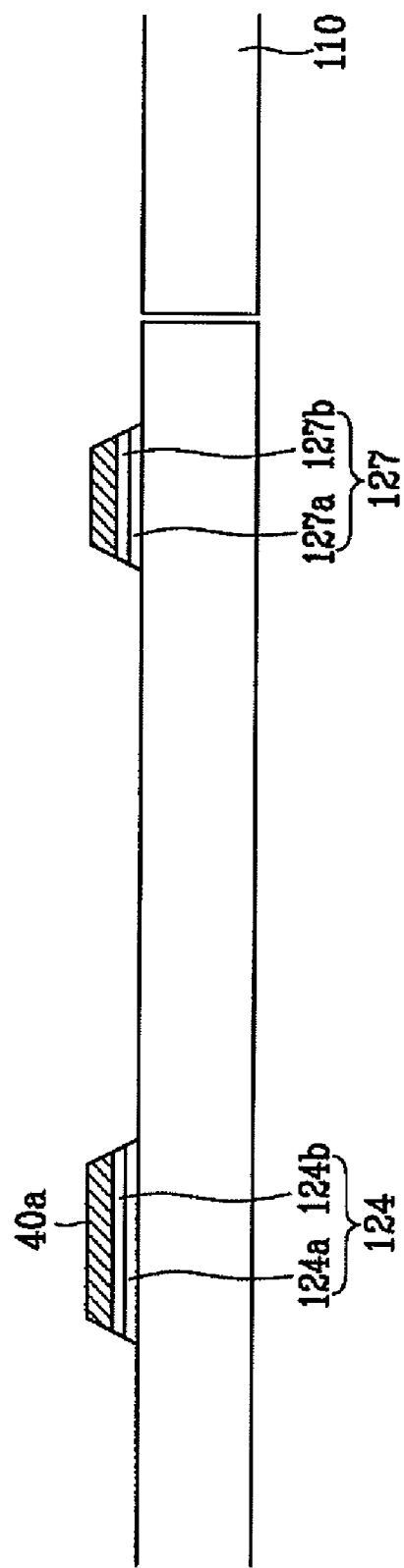

Next, as shown in FIG. 5, portions of the second metal layer 120b and the first metal layer 120a, which are not covered by the photoresist pattern 40a, are etched with an etchant. The etchant may preferably comprise phosphoric acid, nitric acid, acetic acid, and deionized water in predetermined proportions.

Then, the photoresist pattern 40a is stripped by the photoresist stripper of Embodiment 1 of the present invention. The photoresist stripper is sprayed on the photoresist pattern 40a and left for about 60 seconds to about 300 seconds at a temperature of about 50° C. to about 80° C.

In the present embodiment, the photoresist stripper comprises 15 wt % N-MEA 47 wt % of BDG, 35 wt % of NMP, 1.5 wt % MG, and 1.5 wt % of HEP. However, the proportions of the components of the photoresist stripper may be varied in ranges of about 5 wt % to about 20 wt % of an alcohol amine, about 40 wt % to about 70 wt % of a glycol ether, about 20 wt % to about 40 wt % of N-methyl pyrrolidone, and about 0.2 wt % to about 6 wt % of a chelating agent.

In the present embodiment, the photoresist stripper comprises N-MEA as the alcohol amine, BDG as the glycol ether, and MG and HEP as the chelating agents. However, these components are only examples and various other components may be used. For example monoisopropanol amine (CH$_3$CH (OH)CH$_2$NH$_2$) may be used as the alcohol amine and carbitol [C$_2$H$_2$O(CH$_2$CH$_2$O)$_2$H)] or methyl diglycol [CH$_2$O (CH$_2$CH$_2$O$_2$H] may be used as the glycol ether.

Figure 6A:
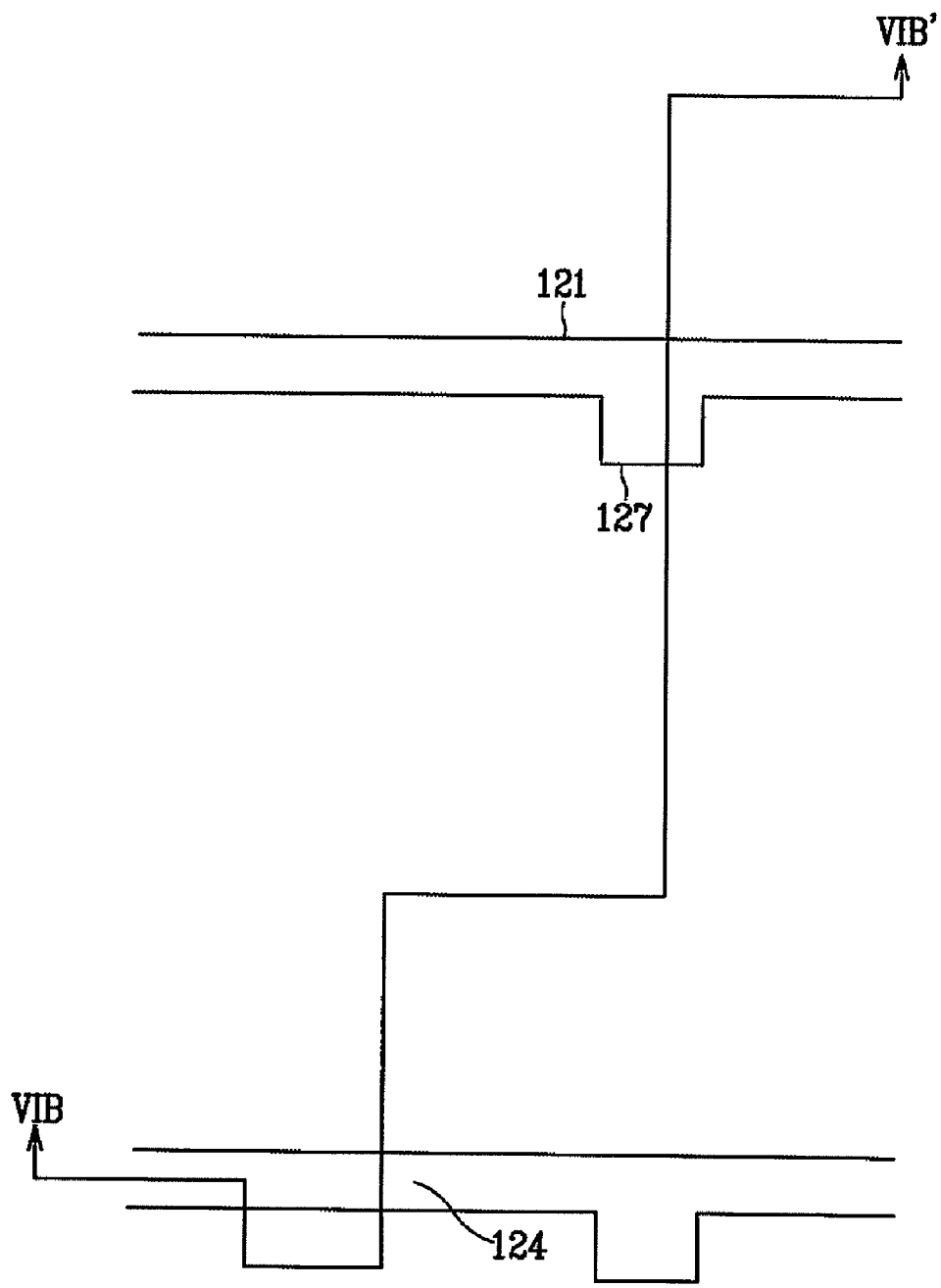
FIG. 6A, FIG. 7A, FIG. 11A, and FIG. 12A are layout views that sequentially illustrate steps of manufacturing a TFT array panel for an LCD according to the exemplary embodiment of FIG. 1 and FIG. 2.

Through the above-described processes as shown in FIG. 6A and FIG. 6B, a plurality of gate lines 121 having a plurality of gate electrodes 124 and expansions 127 are formed.

Figure 7A:
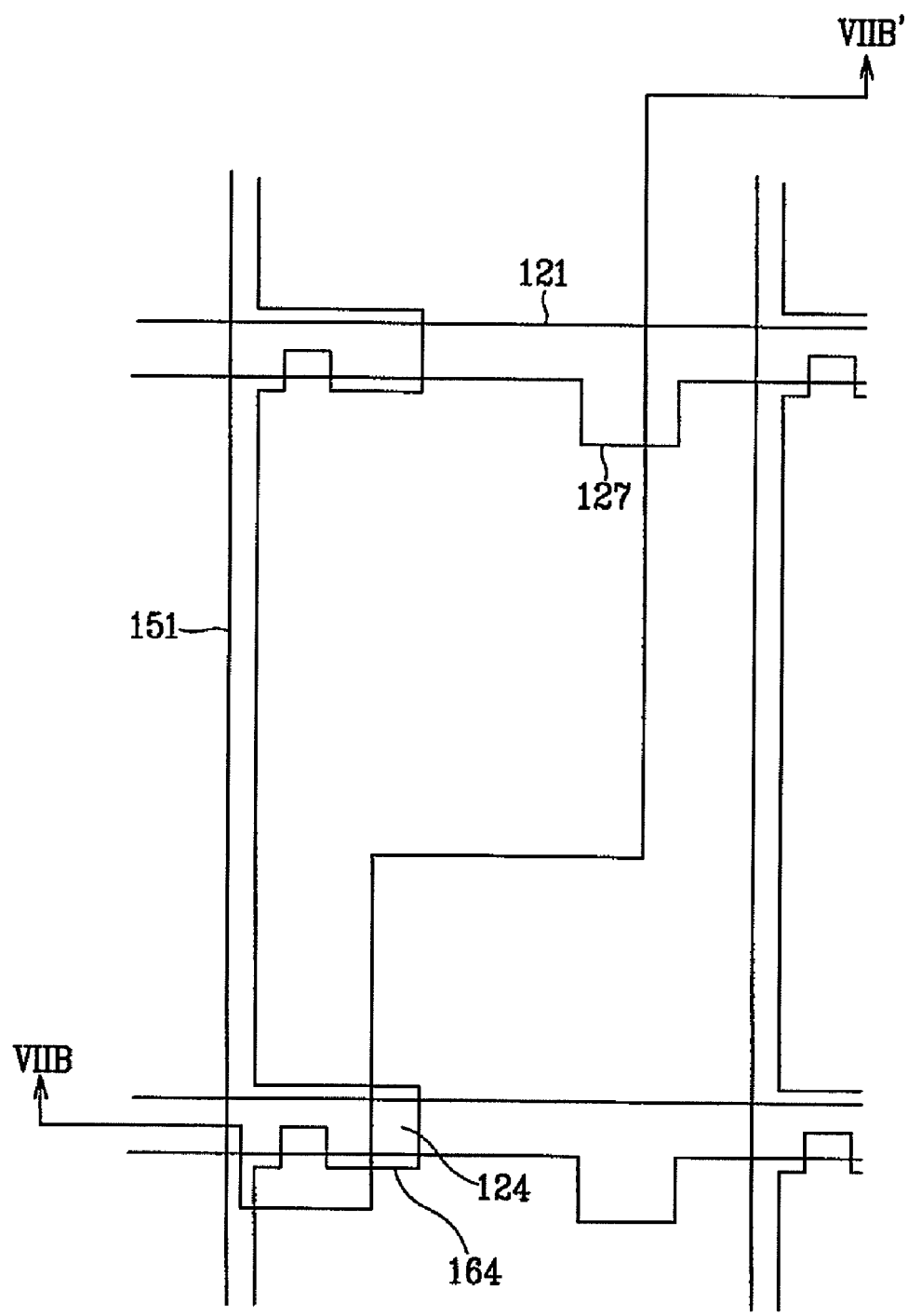
Figure 7B:
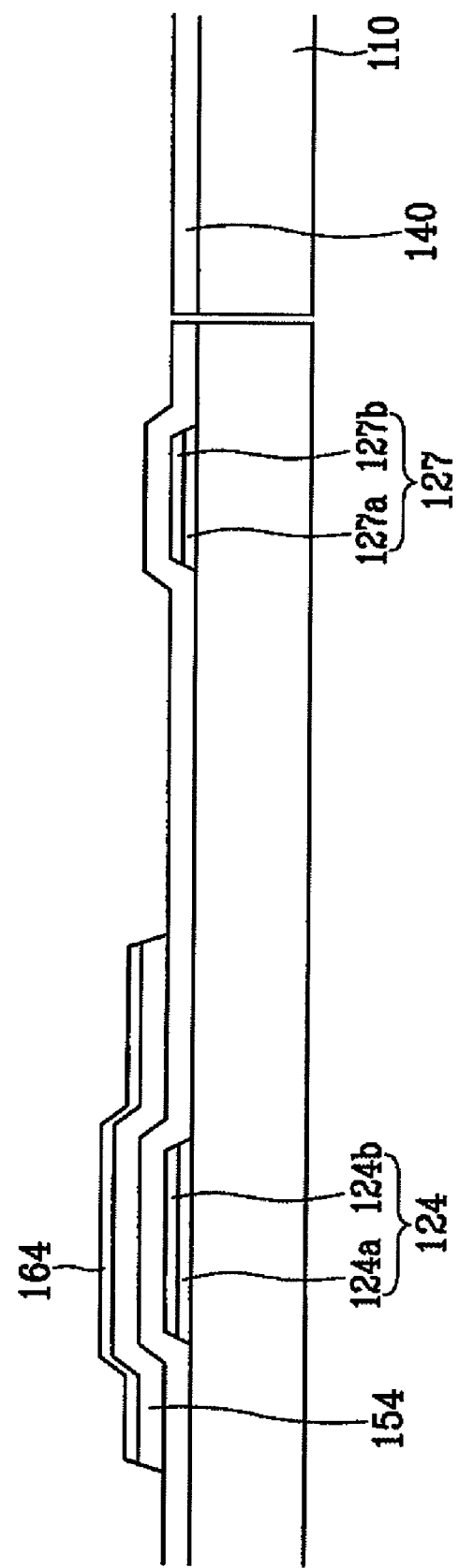

Referring to FIG. 7A and FIG. 7B, after sequential deposition of a gate insulating layer 140, an intrinsic a-Si layer, and an extrinsic a-Si layer, the extrinsic a-Si layer and the intrinsic a-Si layer are photo-etched to form a plurality of extrinsic semiconductor stripes (not shown) and a plurality of intrinsic semiconductor stripes 151 respectively, having projections 164 and 154. The gate insulating layer 140 preferably comprises silicon nitride with a thickness of about 2,000 Å to about 5,000 Å, and the deposition temperature is preferably in a range of about 250° C. and about 500° C.

Figure 8:
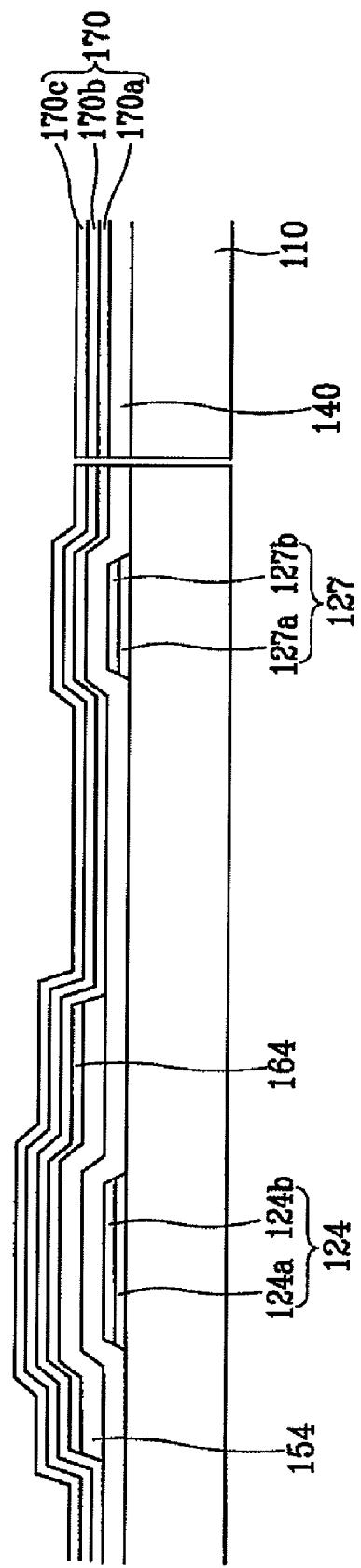

Next, as shown in FIG. 8, a first layer 170a of molybdenum-alloy, a second layer 170b of aluminum (or aluminum-alloy), and a third layer 170c of molybdenum-alloy are sequentially deposited on the extrinsic semiconductor stripes and the gate insulating layer 140. The thickness of the three layer 170a, 170b and 170c is preferably about 3,000 Å. The sputtering temperature is preferably about 150° C.

Figure 9:
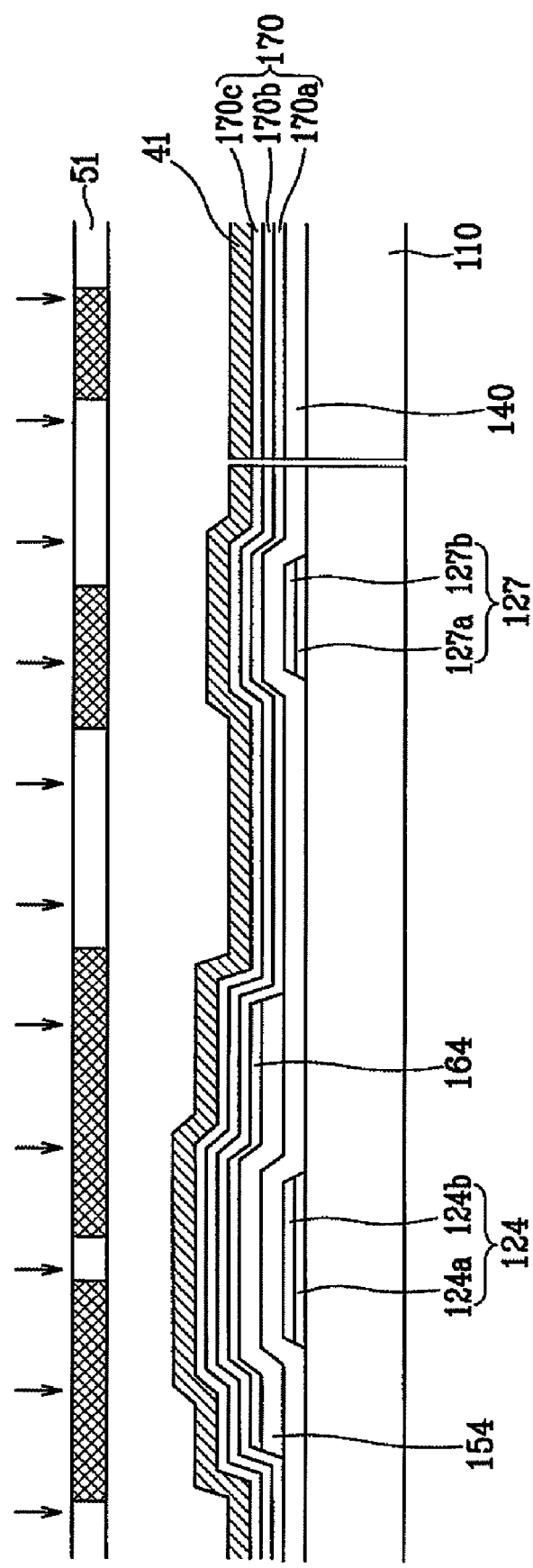

Next, as shown in FIG. 9, a photoresist layer 41 is spin-coated on the third layer 170c and is exposed to light through a photo-mask 51 and developed the photoresist layer 41. By exposing and developing, a plurality of photoresist patterns 41a are formed as shown in FIG. 10.

Figure 10:
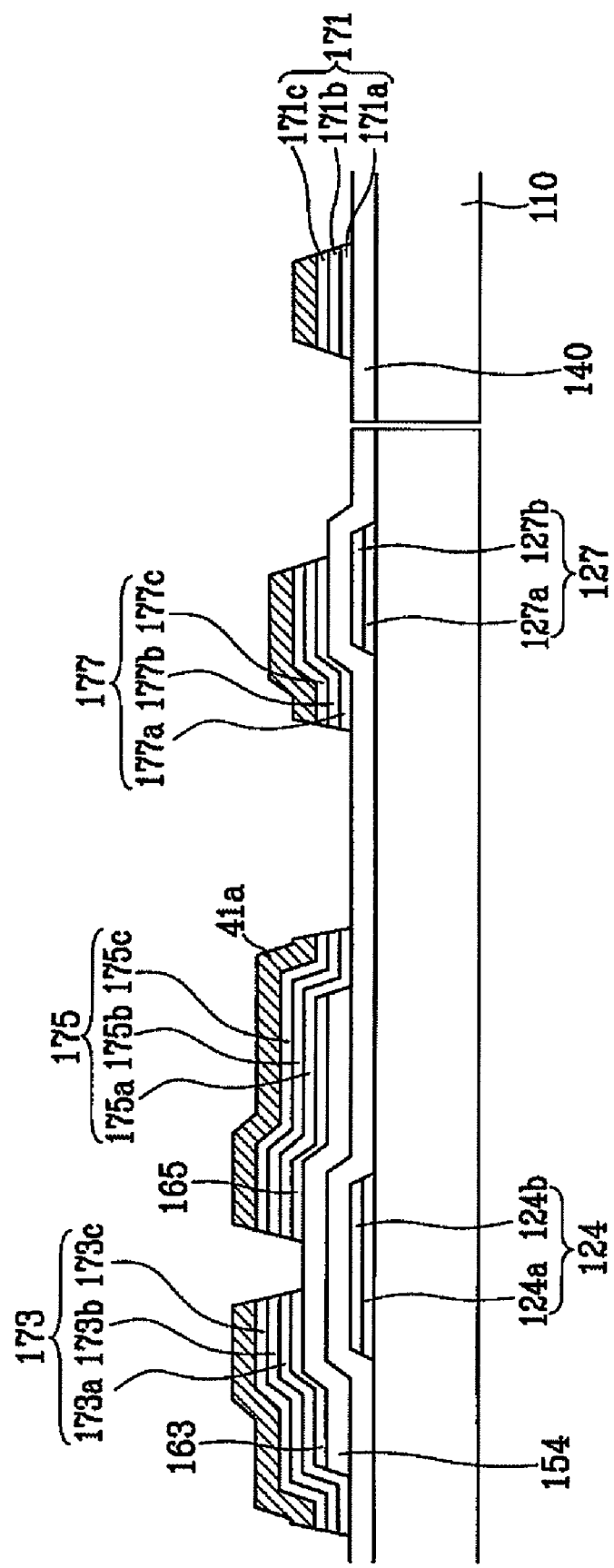

Next, as shown in FIGS. 9 and 10, portions of the third to first layers 170, which are not covered by the photoresist pattern 41a, are etched with an etchant. The etchant preferably comprises phosphoric acid, nitric acid, acetic acid, and deionized water in predetermined proportions.

Then, the photoresist pattern 41a is stripped by the photoresist stripper as in Embodiment 1 and earlier in this third embodiment when photoresist pattern 40a was stripped. The photoresist stripper is sprayed on the photoresist pattern 41a and left for about 60 seconds to about 300 seconds at a temperature of about 50° C. to about 80° C.

Figure 11A:
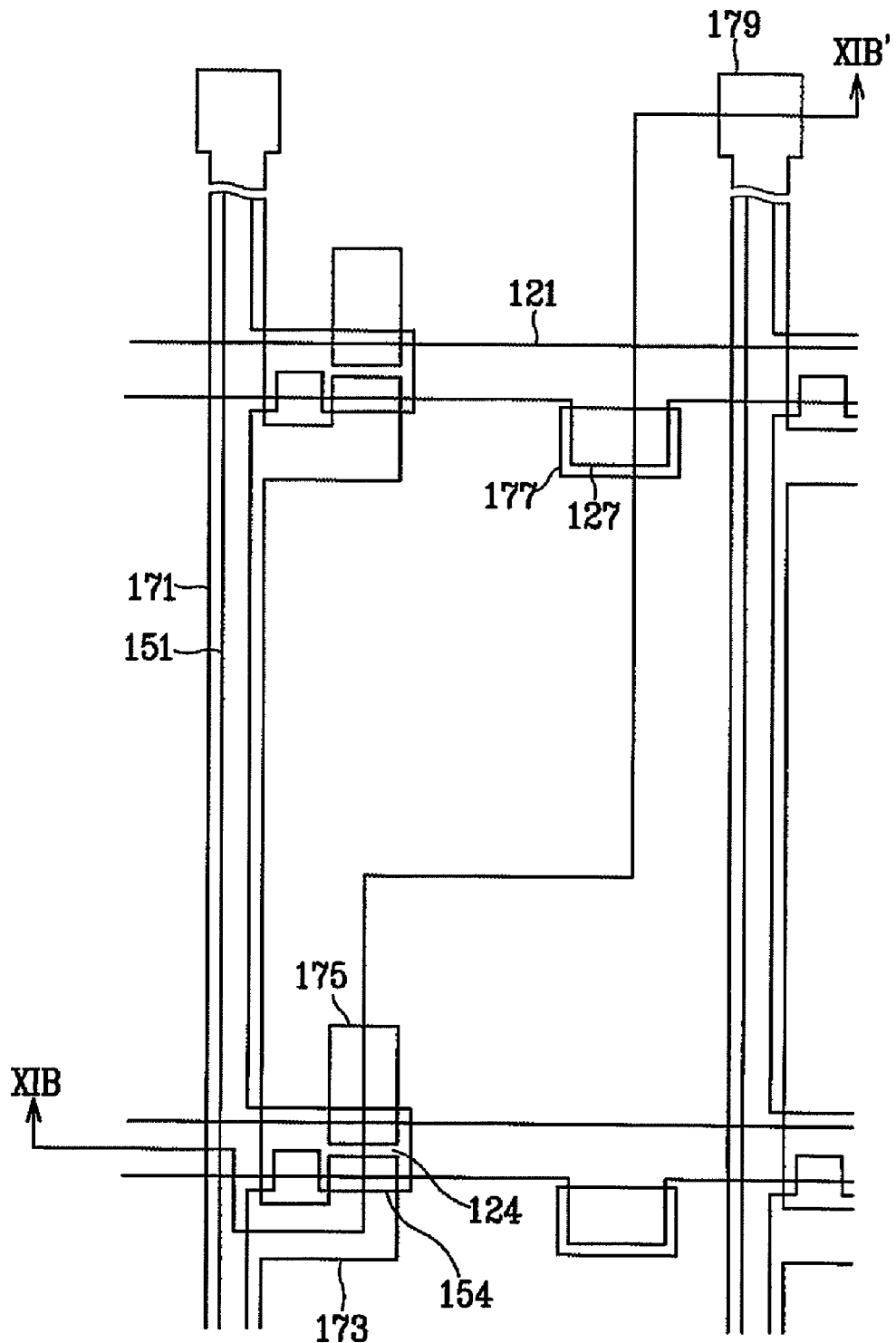
Figure 11B:
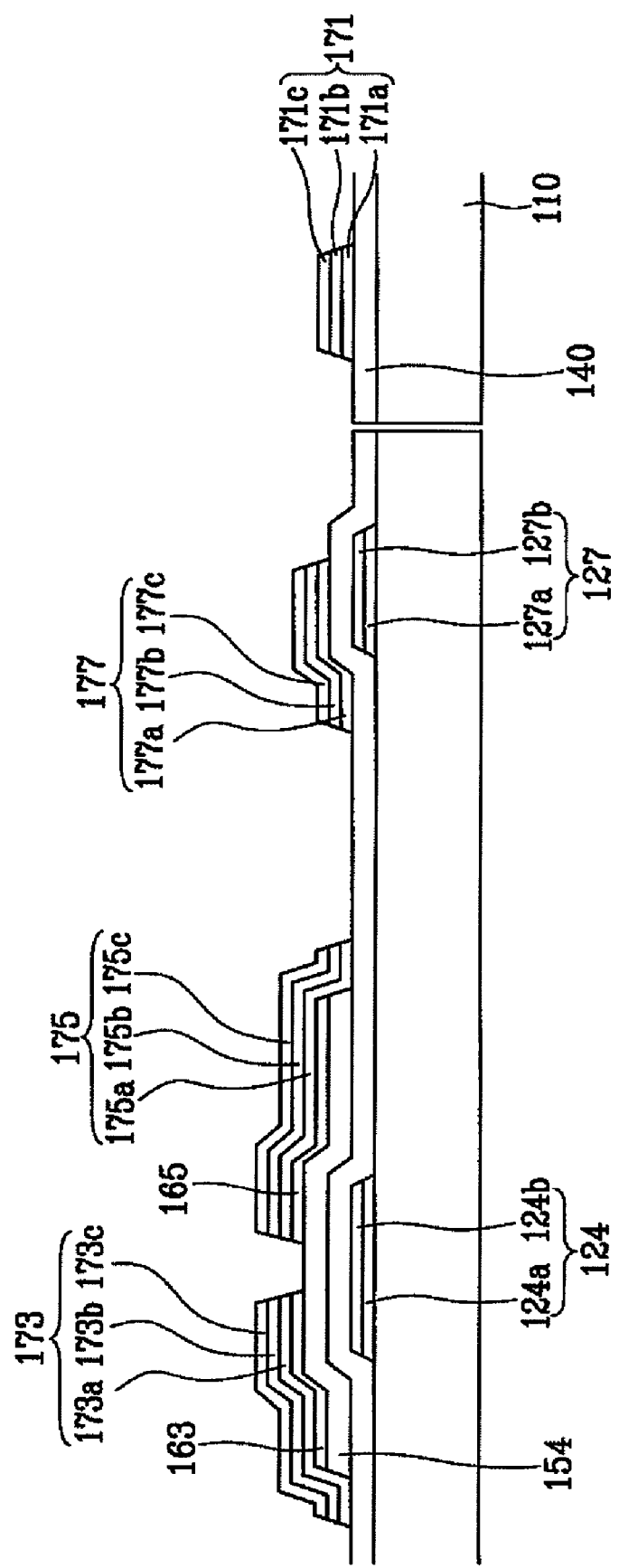

Through the above-described processes as shown in FIG. 11A and FIG. 11B, a plurality of data lines 171 having a plurality of source electrodes 173 and end portions 179, a plurality of drain electrodes 175, and storage capacitor conductors 177 are formed.

Next, portions of the projections 164 of the extrinsic semiconductor stripes 161, which are not covered with the data lines 171 and the drain electrodes 175, are removed by etching to complete a plurality of ohmic contacts 163 and 165 and to expose portions of the intrinsic semiconductor stripes 151. Oxygen plasma treatment may follow thereafter in order to stabilize the exposed surfaces of the semiconductor stripes 151.

Figure 12A:
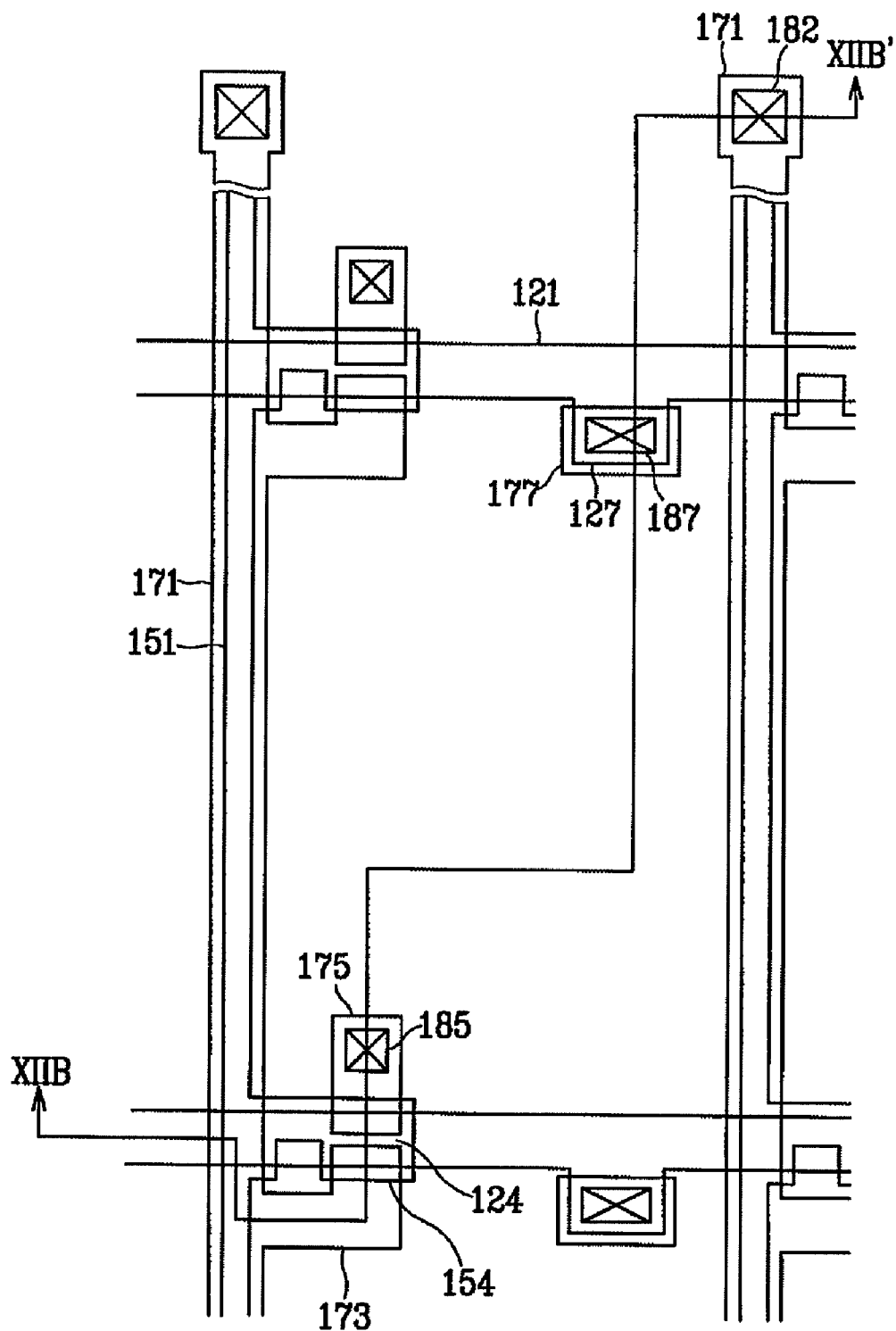
Figure 12B:
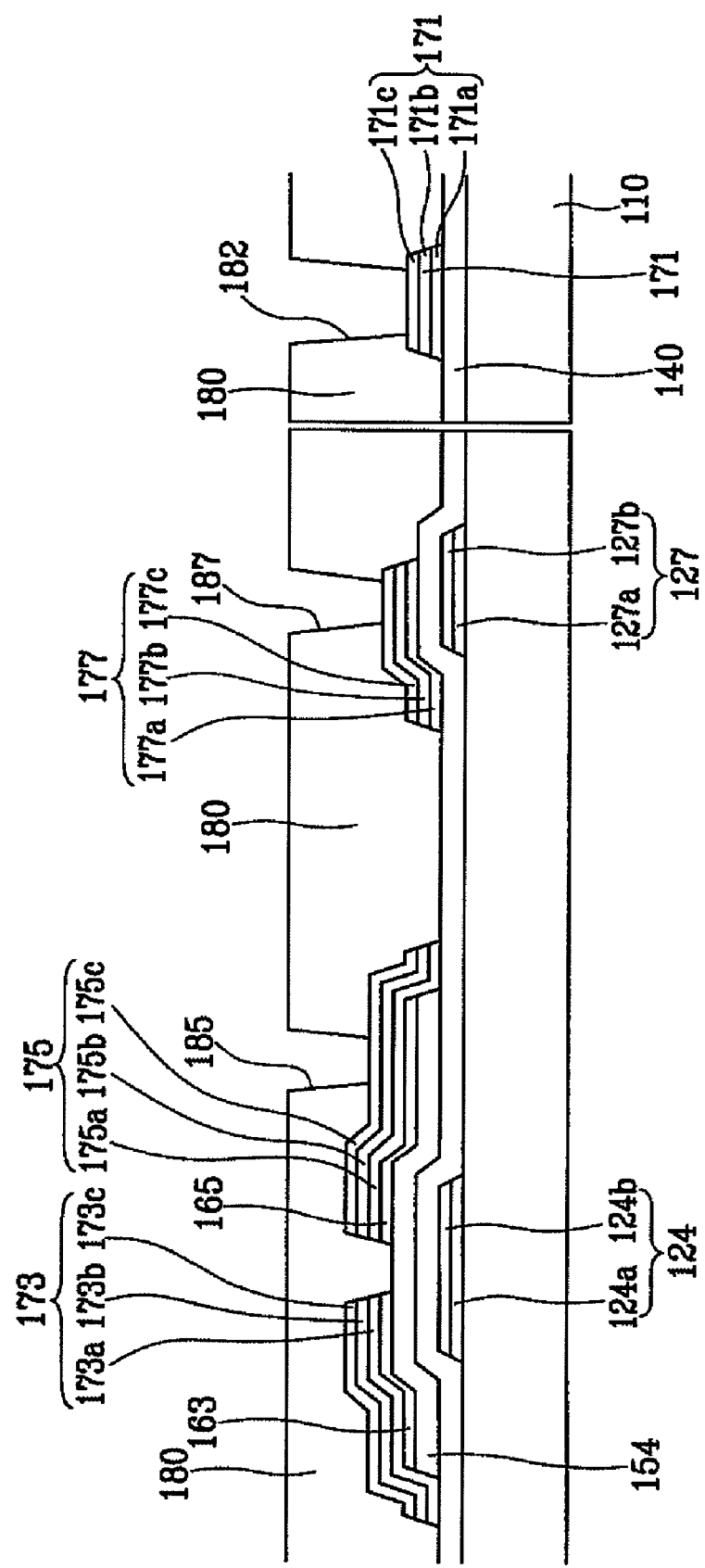

Referring to FIG. 12A and FIG. 12B, a passivation layer 180 is deposited and dry etched along with the gate insulating layer 140 to form a plurality of contact holes 185, 187, and 182. The gate insulating layer 140 and the passivation layer 180 are preferably etched under an etch condition having substantially the same etch ratio.

When the passivation layer comprises a photosensitive material, the contact holes may be formed by photolithography.

Finally, as shown in FIG. 1 and FIG. 2, a plurality of pixel electrodes 190 and a plurality of contact assistants 82 are formed by sputtering and photo-etching an IZO layer or an ITO layer.

The present embodiment illustrates gate lines 121 and data lines 171 that both have a molybdenum-containing layer and an aluminum-containing layer. However, it is possible that only one of the gate lines 121 and data lines 171 have multiple layers.

Embodiment 4

The data lines and the semiconductors are formed by different photoetching processes using different photomasks in the first embodiment. However, the data lines and the semiconductors may be formed simultaneously by a photoetching process using the same photomask to reduce production costs. Such an embodiment will be described in detail with reference to the drawings.

Figure 13:
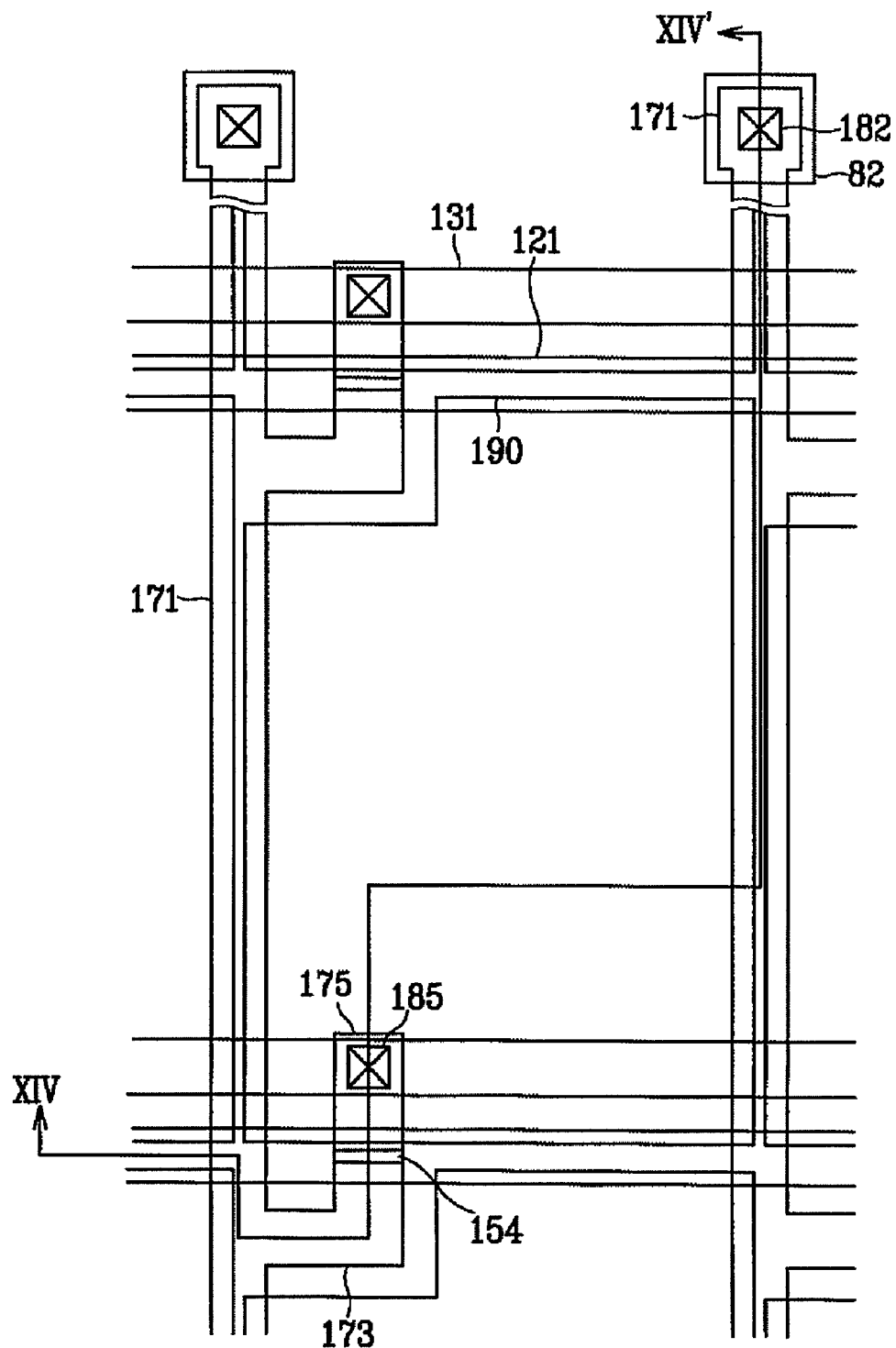
FIG. 13 is a layout view of a TFT array panel for an LCD according to another exemplary embodiment of the present invention.
Figure 14:
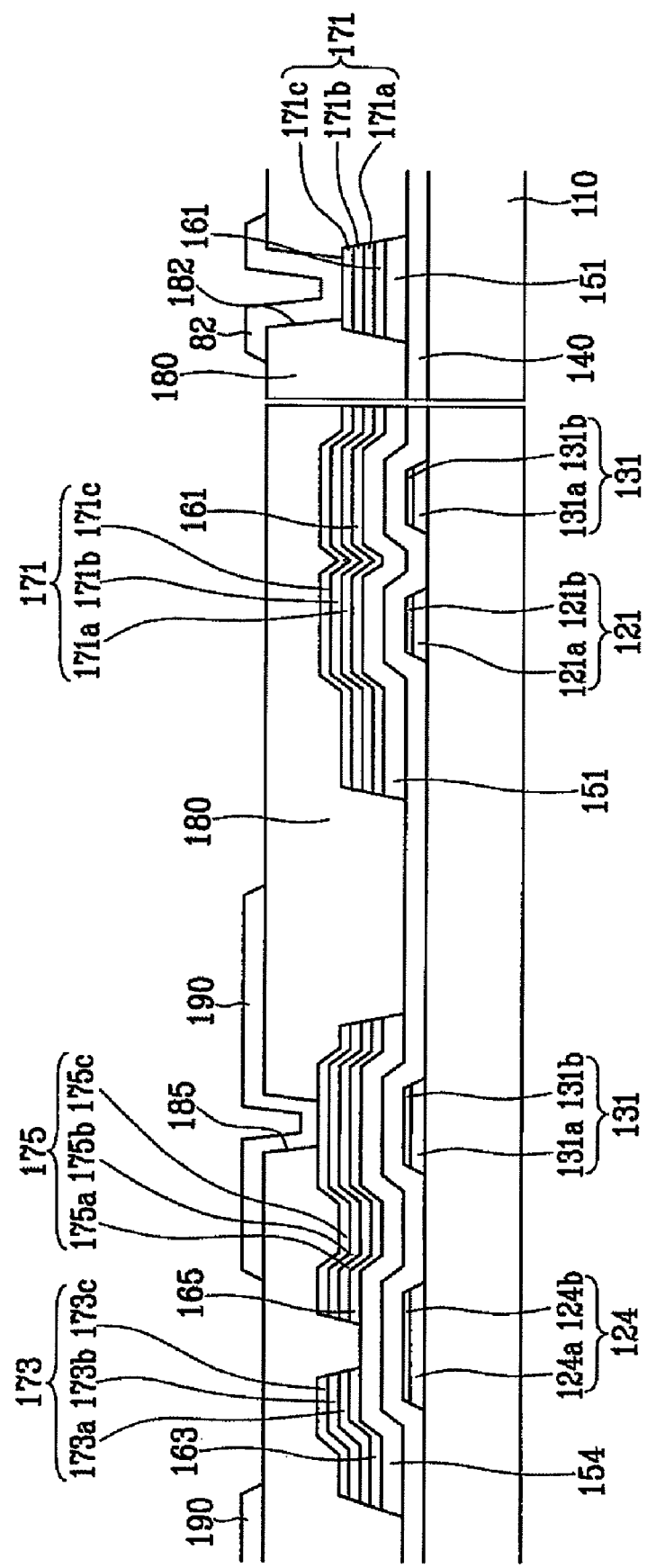
FIG. 14 is a sectional view of the TFT array panel shown in FIG. 13 taken along line XIV-XIV'.

FIG. 13 is a layout view of a TFT array panel for an LCD according to another embodiment of the present invention, and FIG. 14 is a sectional view of the TFT array panel shown in FIG. 13 taken along line XIV-XIV'.

As seen in FIG. 13 and FIG. 14, the layer structure of the present embodiment is very similar to that of the TFT array panel shown in FIG. 1 and FIG. 2.

That is, gate lines 121 having gate electrodes 124 are formed on an insulating substrate 110. A gate insulating layer 140, semiconductor stripes 151 having protrusions 154, and ohmic contacts 163 and 165 are sequentially formed on the gate lines 121. A plurality of data lines 171 having source electrodes 173 and a plurality of drain electrodes 175 are formed on the ohmic contacts 163 and 165 and the gate insulating layer 140. The data lines 171 and the drain electrodes 175 have three metal layers including a first metal layer 171a and 175a comprising a molybdenum-containing metal, a second metal layer 171b and 175b comprising an aluminum-containing metal and a third metal layer 171c and 175c comprising a molybdenum-containing metal. A passivation layer 180 is formed on the data lines 171 and the source electrodes 173. The passivation layer 180 has a plurality of contact holes 182 and 185. A plurality of pixel electrodes 190 and a plurality of contact assistants 82 are formed on the passivation layer 180.

However, the TFT array panel according to the presents embodiment includes a plurality of storage electrode lines 131 that are separated from the gate lines 121 and overlap the drain electrode 175 to form storage capacitors. The storage electrode lines 131 substitute for the expansion 127 of the TFT array panel shown in FIG. 1 and FIG. 2.

The storage capacitors are formed by overlapping the pixel electrodes 190 with the storage lines 131. The storage electrode lines 131 are supplied with a predetermined voltage such as the common voltage. The storage electrode lines 131 may be omitted if the storage capacitance generated by the overlapping of the gate lines 121 and the pixel electrodes 190 is sufficient. The storage electrode lines 131 may be formed along a boundary of the pixels to enhance the aperture ratio.

The data lines 171 and the drain electrodes 175 have substantially the same planar pattern as the ohmic contacts 163 and 165. The semiconductor stripes 151 have substantially the same planar pattern with the ohmic contacts 163 and 165 besides the protrusions 154. The semiconductor stripes 151 have exposed portions that are not covered by the source electrodes 173 and the drain electrodes 175 and are disposed therebetween.

A method for manufacturing the TFT array panel illustrated in FIG. 13 and FIG. 14 will be now described in detail with reference to FIG. 15, FIG. 16, FIG. 17, FIG. 18A, FIG. 19, FIG. 20, FIG. 21A, FIG. 21B, FIG. 22, and FIG. 22B as well as FIG. 13 and FIG. 14.

Figure 15:
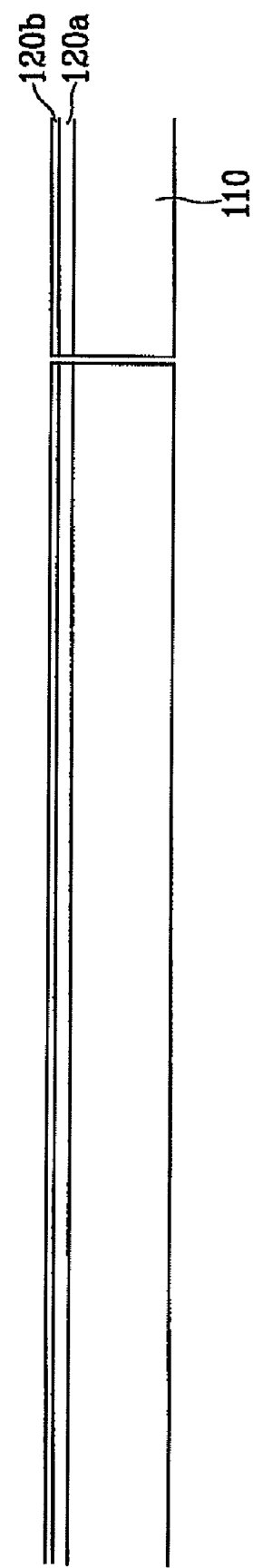
FIG. 15, FIG. 16, FIG. 17, FIG. 18B, FIG. 19, FIG. 20, FIG. 21B, and FIG. 22B are sectional views that sequentially illustrate steps of manufacturing a TFT array panel for an LCD according to the exemplary embodiment of FIG. 13 and FIG. 14.

As shown in FIG. 15, a first metal layer 120a and a second metal layer 120b are sequentially deposited on an insulating substrate 110 by sputtering. The first metal layer 120a comprises aluminum or an aluminum alloy. The second metal layer 120b comprises molybdenum or a molybdenum alloy.

Figure 16:
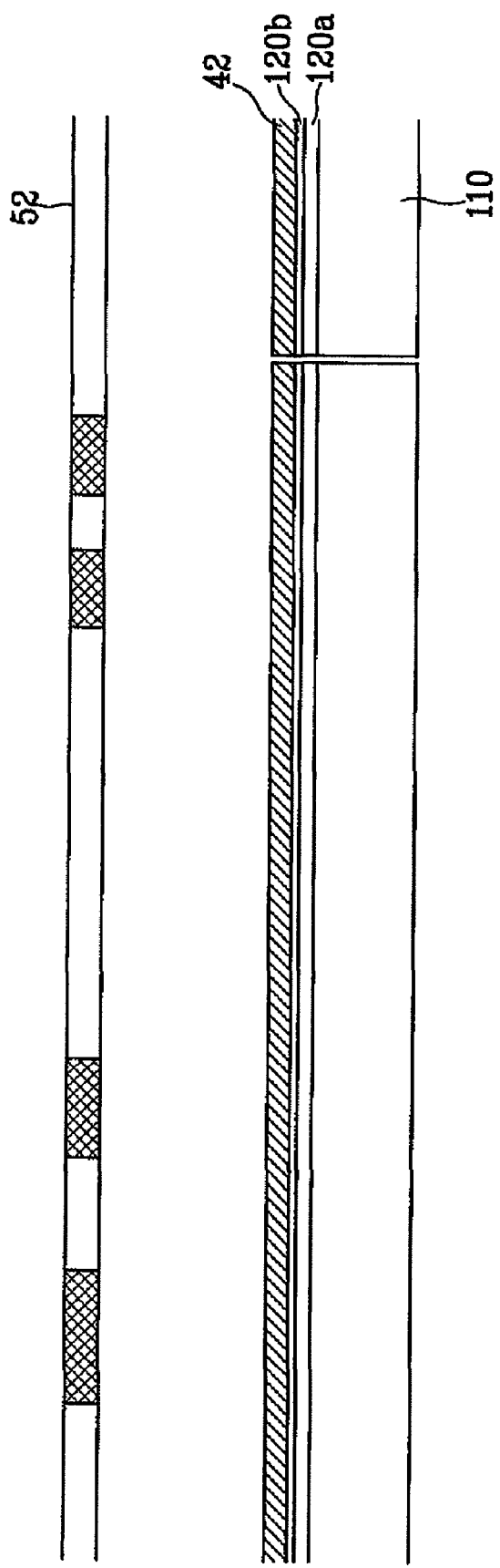

Next as shown in FIG. 16, a photoresist layer 42 is spin-coated on the second metal layer 120b and is exposed to light through a photomask 52. Then, the photoresist layer 40 is developed.

Figure 17:
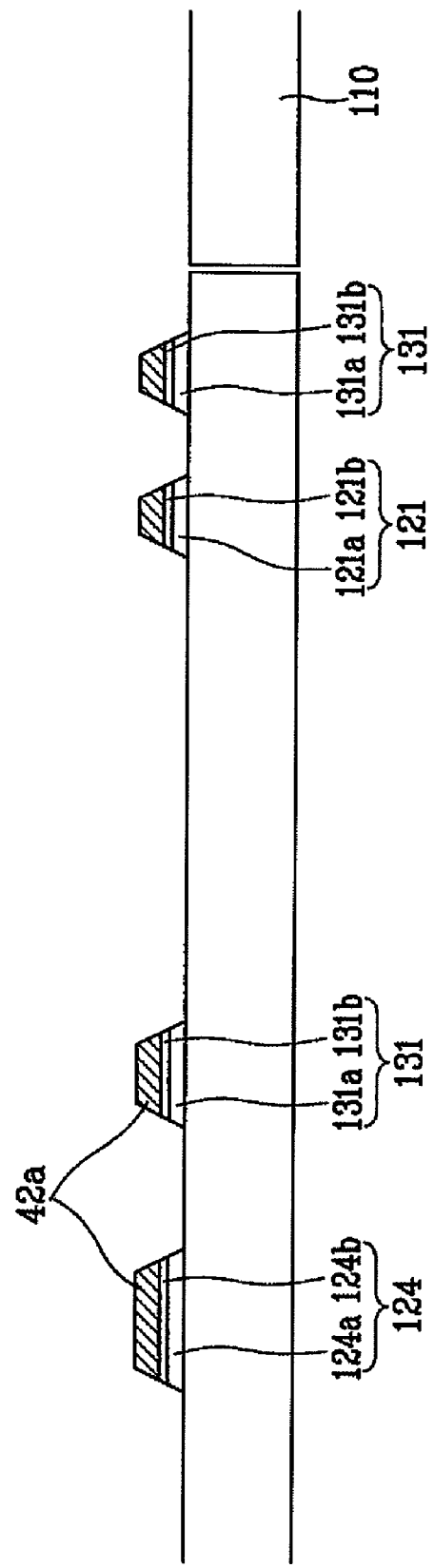

Next, as shown in FIG. 17, portions of the second metal layer 120b and the first metal layer 120a, which are not covered by the photoresist pattern 42a, are etched with an etchant. The etchant may preferably comprise phosphoric acid, nitric acid, acetic acid, and deionized water in predetermined proportions.

Then, the photoresist pattern 42a is stripped by the photoresist stripper of Embodiment 2 of the present invention. The photoresist stripper is sprayed on the photoresist pattern 42a for about 60 seconds to about 300 seconds at a temperature of about 50° C. to about 80° C.

In the present embodiment, the photoresist stripper comprises about 18 wt % of N-MEA, about 51 wt % of BDG, about 25 wt % of NMP, about 3.0 wt % of MG, and about 3.0 wt % of HEP. However, the proportions of the components of the photoresist stripper may be varied in ranges of about 5 wt % to about 20 wt % of the alcohol amine about 40 wt % to about 70 wt % of the glycol ether, about 20 wt % to about 40 wt % of N-methyl pyrrolidone and about 0.2 wt % to about 6 wt % of the chelating agent.

In the present embodiment the photoresist stripper comprises N-MEA as the alcohol amine, BDG as the glycol ether, and MG and HEP as the chelating agents. However, those materials are only examples and various other materials may be used. For example, monoisopropanol amine (CH$_3$CH(OH)CH$_2$NH$_2$) may be used as the alcohol may be used as the glycol ether.

Figure 18A:
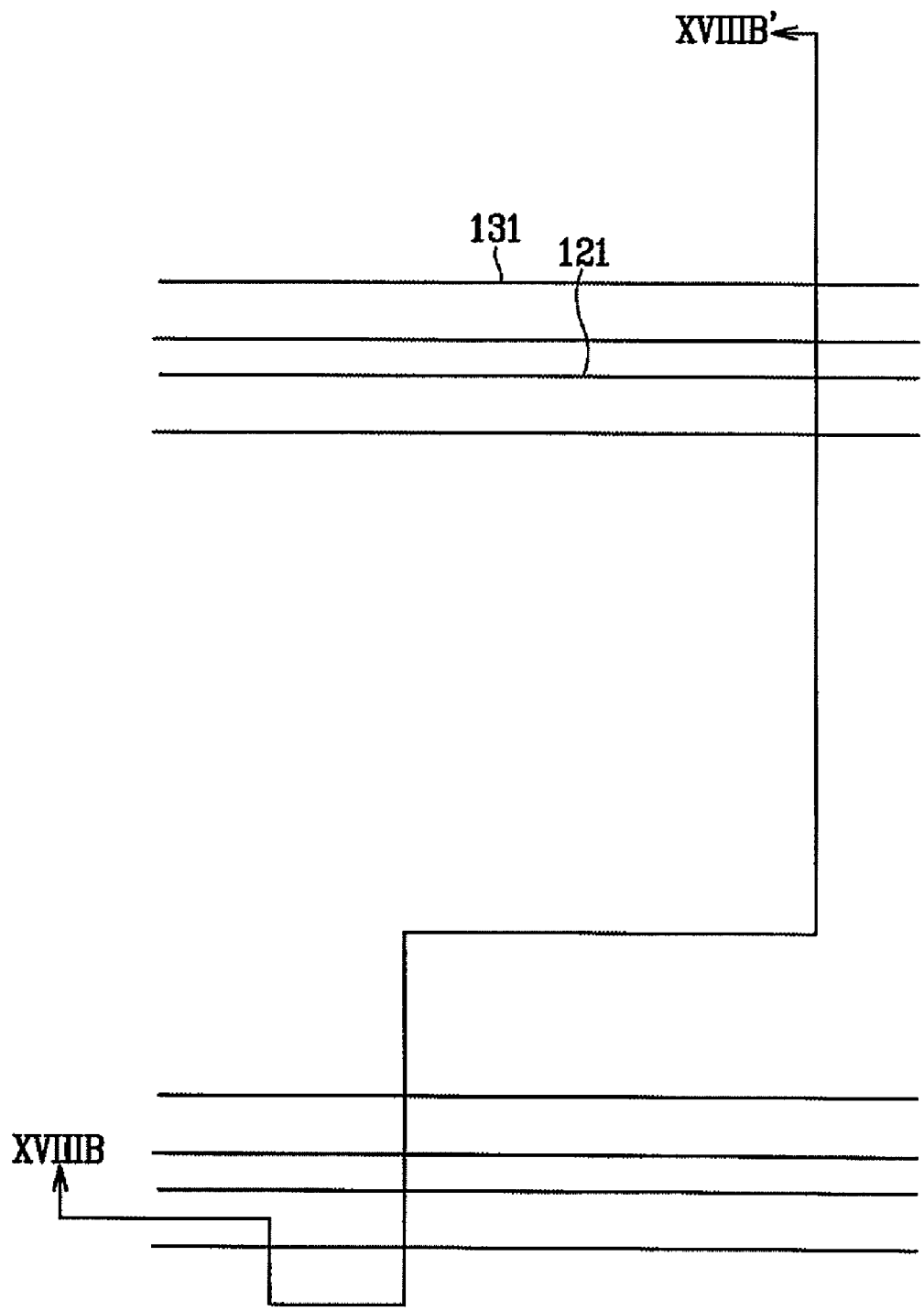
FIG. 18A, FIG. 21A, and FIG. 22A are layout views that sequentially illustrate steps of manufacturing a TFT array panel for an LCD according to the exemplary embodiment of FIG. 13 and FIG. 14.
Figure 18B:
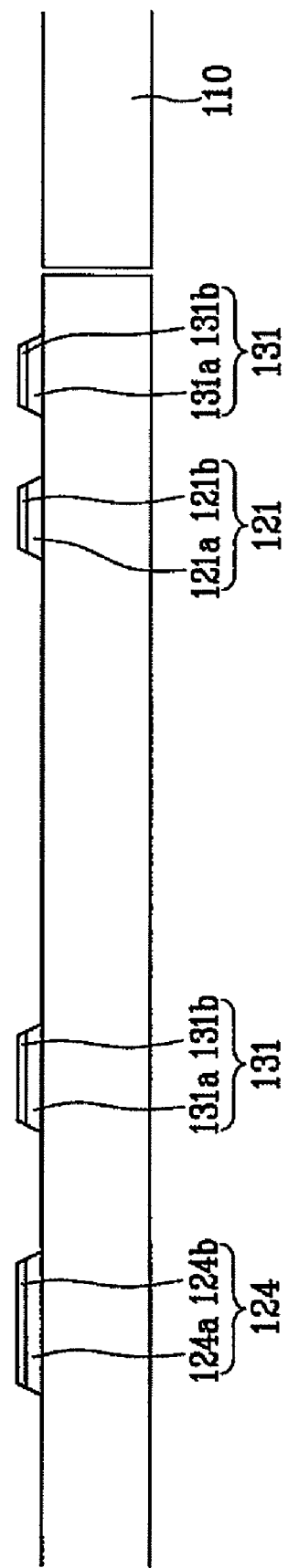

Through the above-described processes, as shown in FIG. 18A and FIG. 18B, a plurality of gate lines 121 having a plurality of gate electrodes 124 and a plurality of storage electrode lines 131 are formed.

Figure 19:
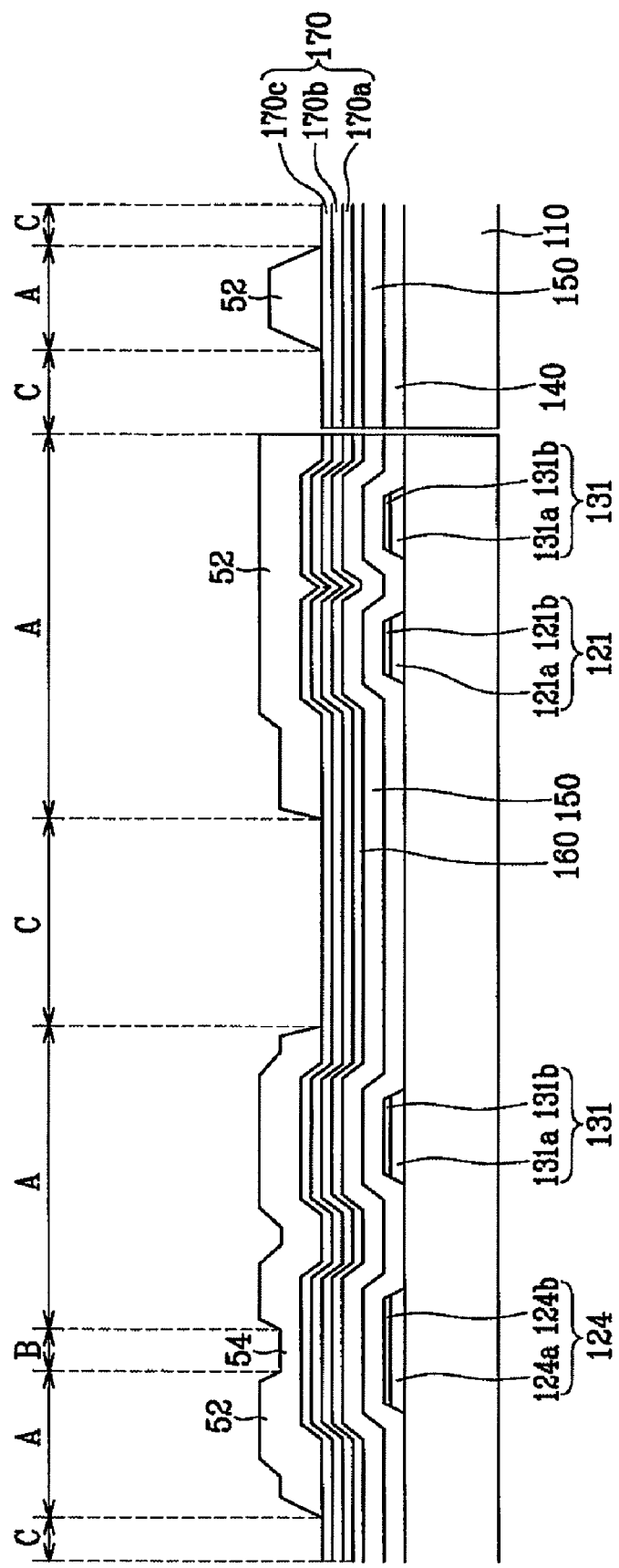

Referring to FIG. 19, a gate insulating layer 140 comprising SiNx, an intrinsic semiconductor layer 150, and an extrinsic semiconductor layer 160 are sequentially deposited. The intrinsic semiconductor layer 150 preferably comprises hydrogenated a-Si, and the extrinsic semiconductor layer 160 preferably comprises silicide or n+ hydrogenated a-Si heavily doped with an n-type impurity.

Next, a first layer 170a of a molybdenum-containing metal, a second layer 170b of an aluminum-containing metal, and a third layer 170c of a molybdenum-containing metal are sequentially deposited on the extrinsic semiconductor layer 160.

A photoresist film is coated on the third layer 170c. The photoresist film is exposed to light through a photomask (not shown), and developed such that the developed photoresist has a position-dependent thickness as shown in FIG. 19. The developed photoresist includes a plurality of first to third portions. The first portions 54 are located on channel areas B and the second portions 52 are located on the data line areas A. No reference numeral is assigned to the third portions that are located on the remaining areas C since they have substantially zero thickness. Here, the thickness ratio of the first portions 54 to the second portions 52 is adjusted depending upon the process conditions in the subsequent process steps. It is preferable that the thickness of the first portions 54 is equal to or less than half the thickness of the second portions 52.

The position-dependent thickness of the photoresist may be achieved by several techniques, for example, by providing translucent areas on the photomask as well as transparent areas and light blocking opaque areas. The translucent areas may have a slit pattern a lattice pattern, or a thin film(s) with intermediate transmittance or intermediate thickness, but are not limited thereto. When using a slit pattern, it is preferable that the width of the slits or the distance between the slits is less than the resolution of a light exposer that is used for the photolithography.

Another example is to use a reflowable photoresist. If a photoresist pattern made of a reflowable material is formed by using a normal exposure mask with only transparent areas and opaque areas, it is subject to a reflow process to flow onto areas without the photoresist, thereby forming thin portions.

Figure 20:
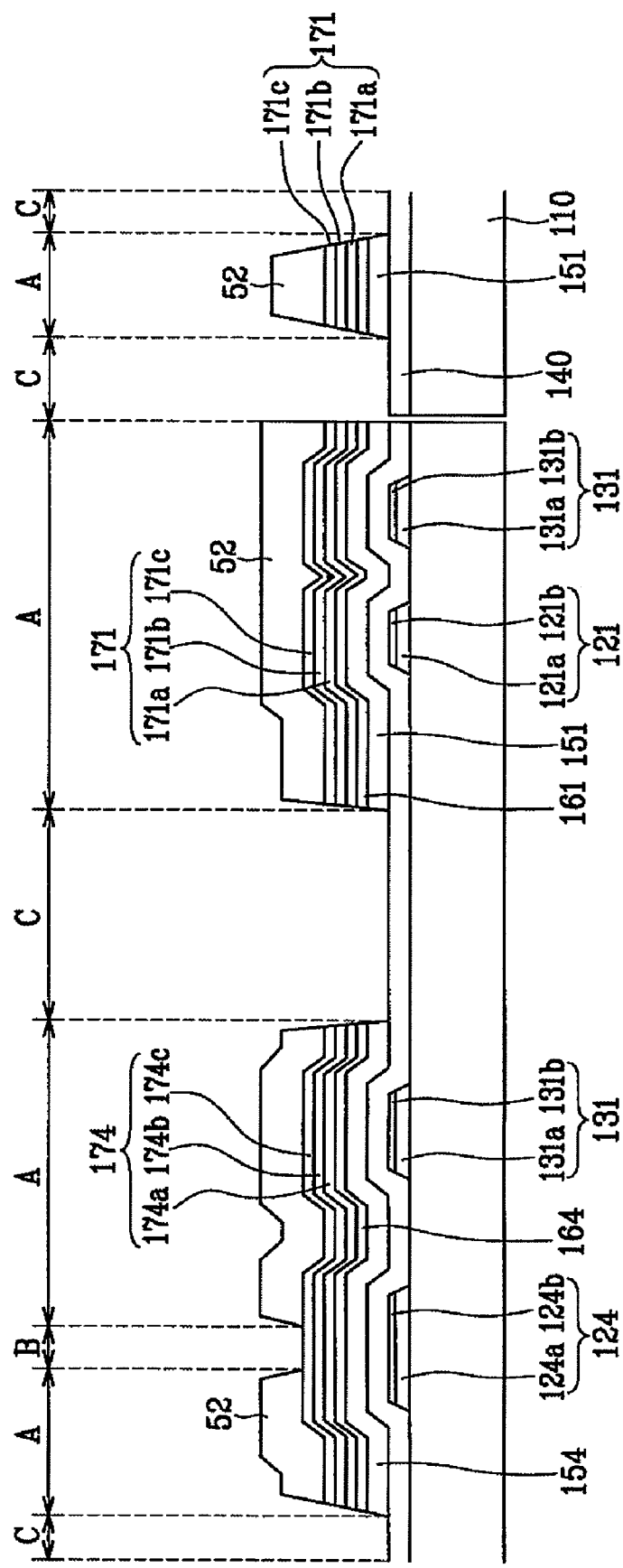

As shown in FIG. 20, the photoresist film 52 and 54 and the underlying layers are then etched such that the data lines 171, drain electrodes 175, and the underlying layers are left on the data areas A, only the intrinsic semiconductor layer is left on the channel areas B, and the gate is exposed on the remaining areas C.

Then, the photoresist patterns 52 and 54 are stripped by the photoresist stripper of Embodiment 2 and earlier in this fourth embodiment when photoresist pattern 42a was stripped. The photoresist stripper as described earlier is sprayed on the photoresist pattern 52 and 54 and left for about 60 seconds to about 300 seconds at a temperature of about 50° C. to about 80° C.

Figure 21A:
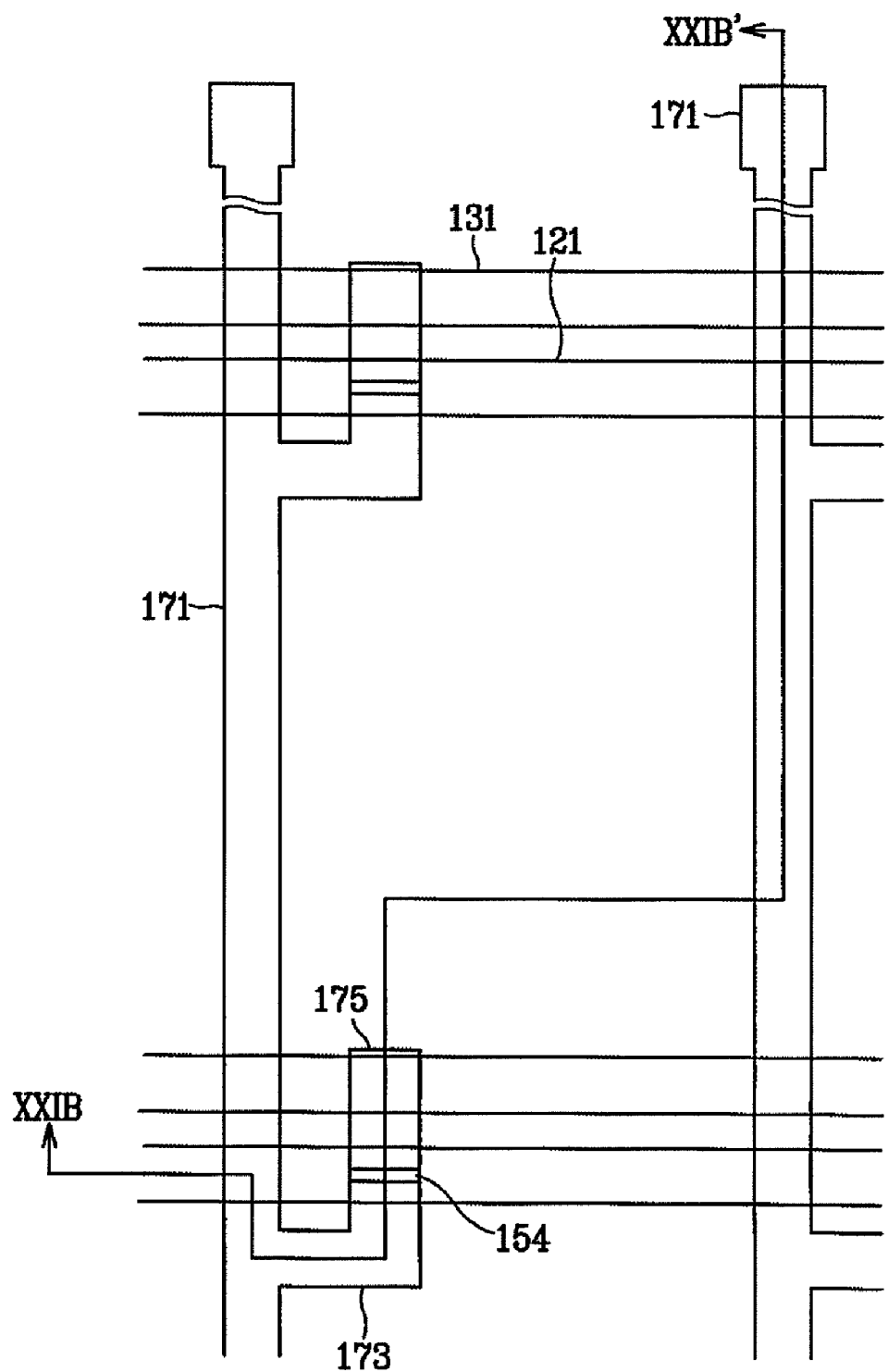
Figure 21B:
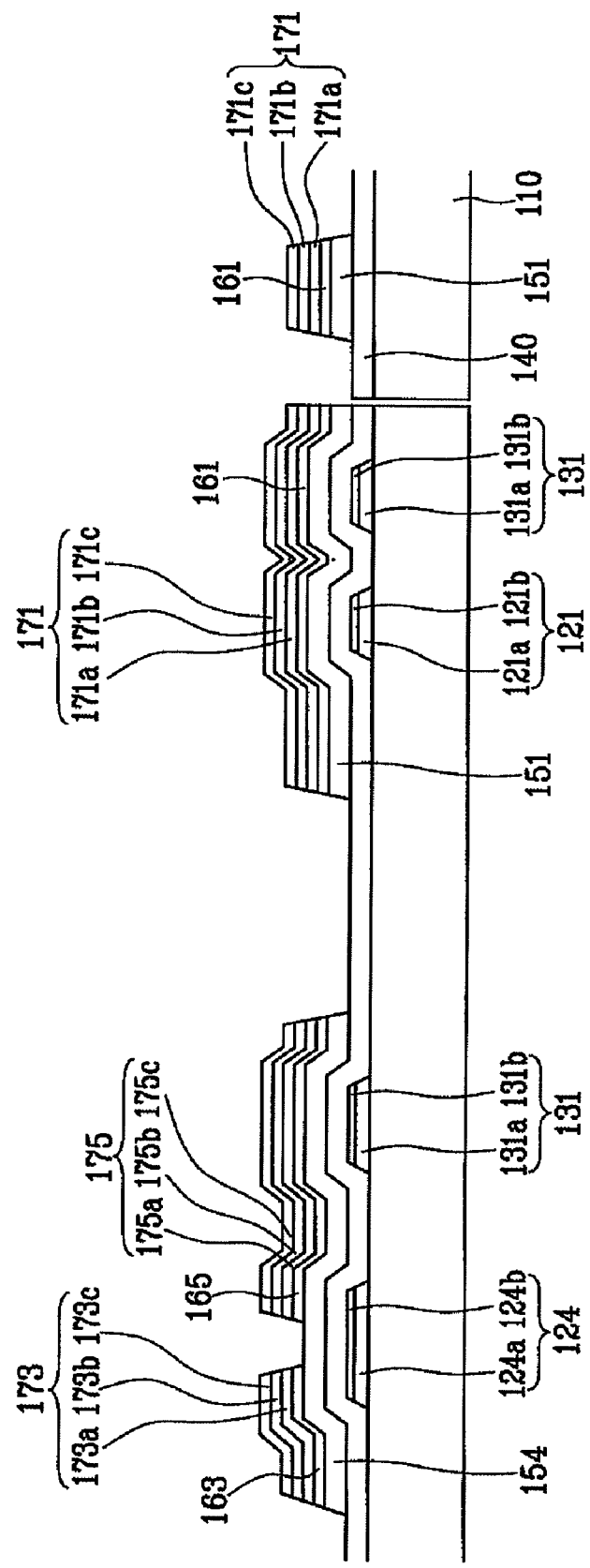

Through the above-described processes, as shown in FIG. 21A and FIG. 21B, a plurality of data lines 171 having source electrodes 173, drain electrodes 175, ohmic contacts 163 and 165 and semiconductor stripes 151 are formed.

A method for forming such a structure will now be described.

Referring to FIG. 20 the exposed portions of the first, second, and third layers 170a, 170b, and 170c on the areas C are removed to expose the underlying portions of the extrinsic semiconductor layer 160.

Next, the exposed portions of the extrinsic semiconductor layer 160 and the underlying portions of the intrinsic semiconductor layer 150 on the areas C as well as the photoresist pattern 54 and 52 are removed by dry etching to expose source and drain (S/D) metals 174 of the areas B.

The photoresist pattern 54 of the channel areas B may be simultaneously removed by etching to remove the extrinsic semiconductor 160 and the intrinsic semiconductor 150, or by a separate etching process. Residual photoresist of the photoresist pattern 54 in the channel area B may be removed by ashing. In this step the semiconductor stripes 151 are completely formed.

The data conductor layer 170 may be etched by dry etching along with the ohmic contact layer 160 and the a-Si layer 150 to simplify manufacturing processes. In this case, the three layers 170, 160, and 150 may be etched sequentially in a dry etching chamber, referred to as an "in-situ" method.

Next, as shown in FIG. 21A and FIG. 21B, portions of the S/D metals 174 and the underlying portions of the extrinsic semiconductor layer 160 on the channel areas B are etched to be removed. At this time, the exposed portions of the semiconductor 154 may be etched to have a reduced thickness and the second portion 52 of the photoresist pattern may also be partially removed.

Accordingly, the source electrodes 173 and the drain electrodes 175 are separated from each other, and, the data lines and the ohmic contacts 163 and 165 thereunder are completed.

Figure 22A:
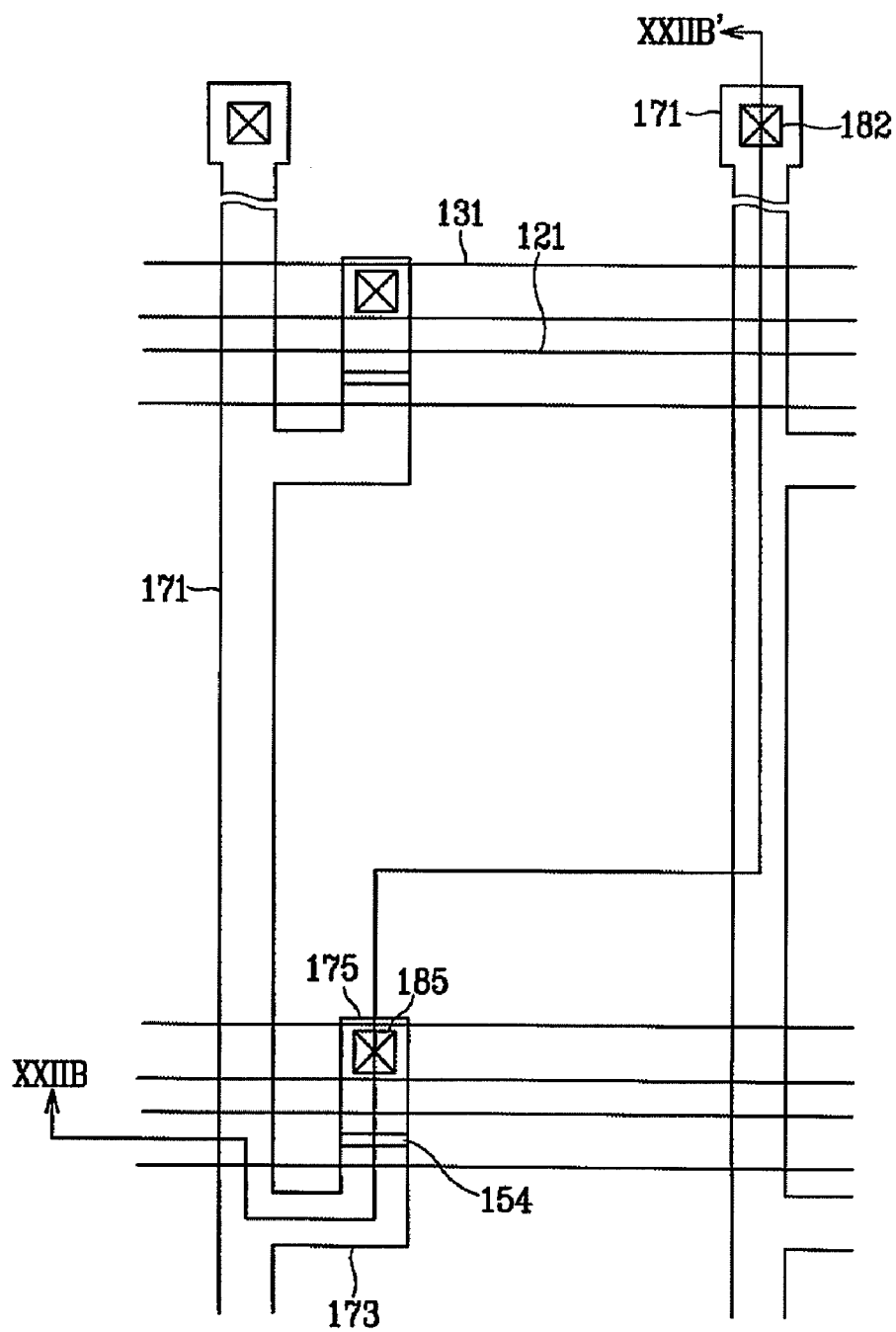
Figure 22B:
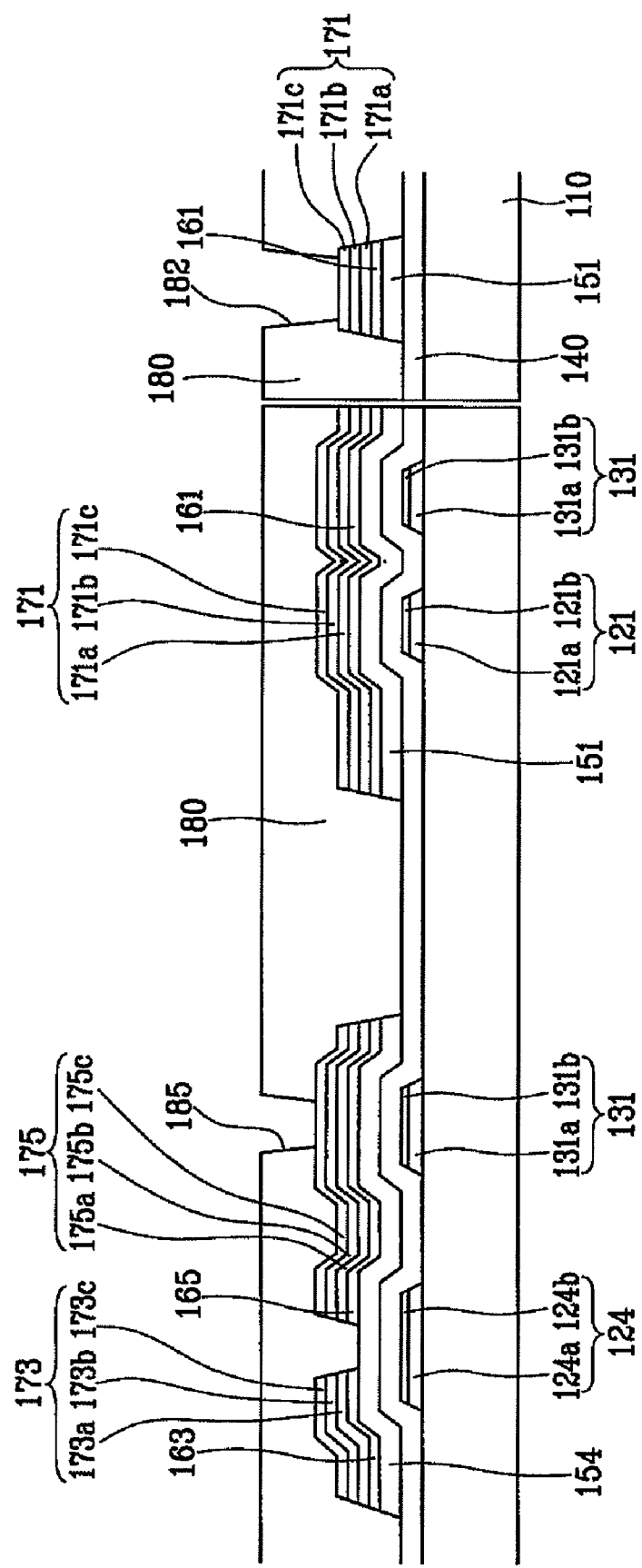

Thereafter, as shown in FIG. 22A and FIG. 22B, a passivation layer 180 is formed to cover the data lines 171, the drain electrodes 175, and the exposed portions of the semiconductor stripes 151 that are not covered with the data lines 171 and the drain electrodes 175. The passivation layer 180 preferably comprises a photosensitive organic material that has good flatness characteristics, a dielectric insulating material that has a low dielectric constant of under 4.0 such as a-Si:C:O and a-Si:O:F that is formed by PECVD or an inorganic material such as silicon nitride and silicon oxide.

Next, the passivation layer 180 is photo-etched to form a plurality of contact holes 185 and 182. When the passivation layer 180 comprises a photosensitive material, the contact holes 185 and 182 may be formed by photolithography.

Finally, as previously shown in FIG. 13 and FIG. 14, a plurality of pixel electrodes 190 and a plurality of contact assistants 82 are formed by sputtering and photo-etching an IZO layer or an ITO layer. The pixel electrodes 190 and the contact assistants 82 are respectively coupled with the drain electrodes 175 and an end of the data lines 171 through the contact holes 185 and 182.

The present embodiment illustrates gate lines 121 and data lines 171 both having a molybdenum-containing layer and an aluminum-containing layer. However, it is possible that only one of the gate lines 121 and data lines 171 have multiple layers.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed:

1. A photoresist stripper, comprising:
about 5 wt % to about 20 wt % alcohol amine;
about 40 wt % to about 70 wt % glycol ether;
about 20 wt % to about 40 wt % N-methyl pyrrolidone; and
about 0.2 wt % to about 6 wt % chelating agent, wherein the chelating agent is one of methyl gallate, hydroxyl ethyl piperazine (HEP), and a mixture thereof.

2. The photoresist stripper of claim 1,
wherein the alcohol amine is one of monoisopropanol amine ($CH_3CH(OH)CH_2NH_2$), N-monoethanol amine ($HO(CH_2)_2NH_2$), and a mixture thereof.

3. The photoresist stripper of claim 1,
wherein the glycol ether is one of diethylene glycol monoethyl ether [$C_2H_5O(CH_2CH_2O)_2H$)], methyl diglycol [$CH_3O(CH_2CH_2O)_2H$], butyl diglycol [$C_4H_9O(CH_2CH_2O)_2H$], and a mixture thereof.

4. The photoresist stripper of claim 1,
wherein the alcohol amine is monoisopropanol amine ($CH_3CH(OH)CH_2NH_2$) and the glycol ether is butyl diglycol [$C_4H_9O(CH_2CH_2O)_2H$].

5. The photoresist stripper of claim 1, wherein concentrations of methyl gallate and hydroxyl ethyl piperazine (HEP) are substantially the same.

6. A photoresist stripper, comprising:
about 5 wt % to about 20 wt % N-monoethanol amine;
about 40 wt % to about 70 wt % butyl diglycol;
about 20 wt % to about 40% N-methyl pyrrolidone; and
about 0.2 wt % to about 6 wt % a chelating agent, wherein the chelating agent is one of methyl gallate, hydroxyl ethyl piperazine (HEP), and a mixture thereof.

7. A photoresist stripper, comprising:
about 5 wt % to about 20 wt % N-monoethanol amine;
about 40 wt % to about 70 wt % butyl diglycol;
about 20 wt % to about 40 wt % N-methyl pyrrolidone;
about 0.1 wt % to about 3 wt % methyl gallate; and
about 0.1 wt % to about 3 wt % hydroxyl ethyl piperazine.

* * * * *